(12) United States Patent
Koyama

(10) Patent No.: US 9,058,978 B2
(45) Date of Patent: Jun. 16, 2015

(54) MEMORY DEVICE AND METHOD OF MANUFACTURING THE SAME

(75) Inventor: Kazuhide Koyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 179 days.

(21) Appl. No.: 13/549,090

(22) Filed: Jul. 13, 2012

(65) Prior Publication Data

US 2013/0021834 A1 Jan. 24, 2013

(30) Foreign Application Priority Data

Jul. 22, 2011 (JP) ................................ 2011-161201

(51) Int. Cl.
| | | |
|---|---|---|
| H01L 47/00 | (2006.01) | |
| G11C 11/00 | (2006.01) | |
| H01L 21/02 | (2006.01) | |
| H01L 27/02 | (2006.01) | |
| H01L 27/24 | (2006.01) | |
| H01L 45/00 | (2006.01) | |

(52) U.S. Cl.
CPC .............. *H01L 27/0207* (2013.01); *H01L 45/04* (2013.01); *H01L 45/06* (2013.01); *H01L 45/085* (2013.01); *H01L 45/1233* (2013.01); *H01L 45/1266* (2013.01); *H01L 45/144* (2013.01); *H01L 45/146* (2013.01); *H01L 45/1625* (2013.01); *H01L 45/1683* (2013.01); *H01L 27/2436* (2013.01); *H01L 27/2463* (2013.01)

(58) Field of Classification Search
CPC .......... G11C 13/0002; G11C 13/0004; G11C 13/0007; G11C 13/0009; H01L 45/04; H01L 45/06; H01L 28/20; H01L 27/0802
USPC ................................ 365/148; 257/4; 438/382
See application file for complete search history.

(56) References Cited

U.S. PATENT DOCUMENTS

| | | | |
|---|---|---|---|
| 7,345,908 B2 * | 3/2008 | Hachino et al. ............... | 365/148 |
| 7,859,886 B2 * | 12/2010 | Kinoshita ..................... | 365/148 |
| 7,977,661 B2 * | 7/2011 | Philipp et al. ..................... | 257/2 |
| 2009/0184396 A1 * | 7/2009 | Kim et al. ..................... | 257/536 |
| 2011/0066900 A1 * | 3/2011 | Tokiwa ......................... | 714/704 |
| 2012/0127778 A1 * | 5/2012 | Miyata et al. ................. | 365/148 |

OTHER PUBLICATIONS

Changhyun Cho et al.; A 6F2 DRAM Technology in 60nm era for Gigabit Densities; 2005 Symposium on VlSI Technology Digest of Technical Papers.
Y. K. Park et al.; Fully Integrated 56 nm DRAM Technology for 1 Gb DRAM; 2007 Symposium on VlSI Technology Digest of Technical Papers.

* cited by examiner

*Primary Examiner* — Hoai V Ho
*Assistant Examiner* — Tri Hoang
(74) *Attorney, Agent, or Firm* — Dentons US LLP

(57) ABSTRACT

A memory device includes a plurality of memory elements, each having a first electrode, a second electrode, and a memory layer between the first electrode and the second electrode. The plurality of memory layers are in a dotlike pattern. Two adjacent first electrodes share a same memory layer.

19 Claims, 24 Drawing Sheets

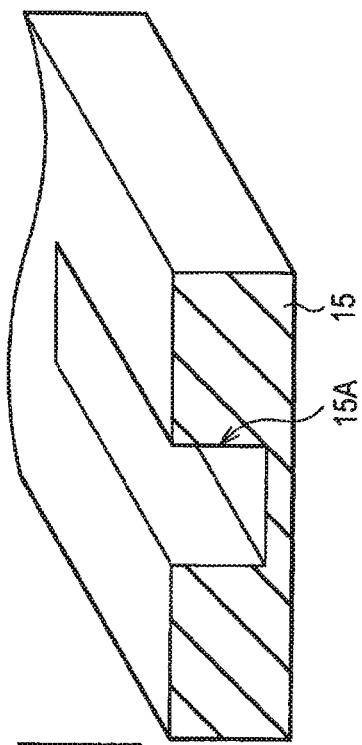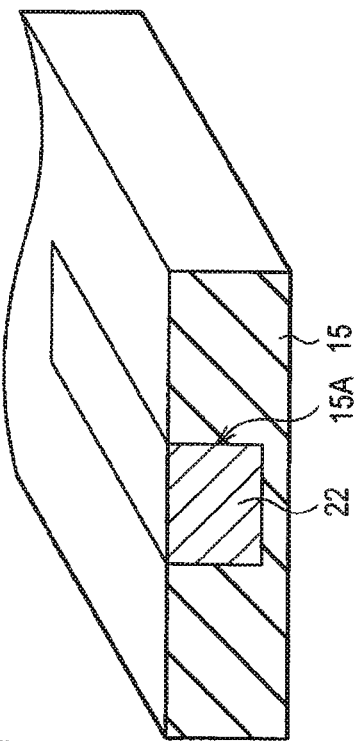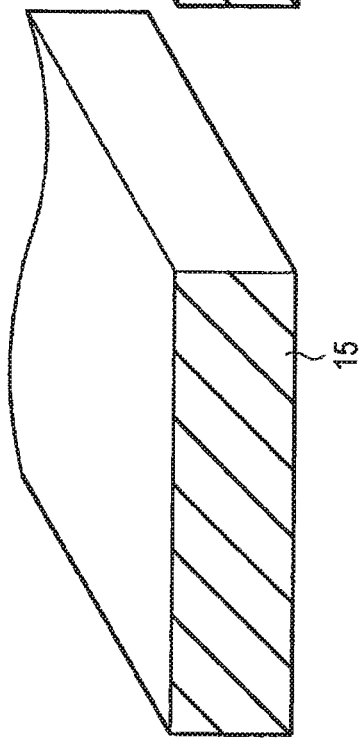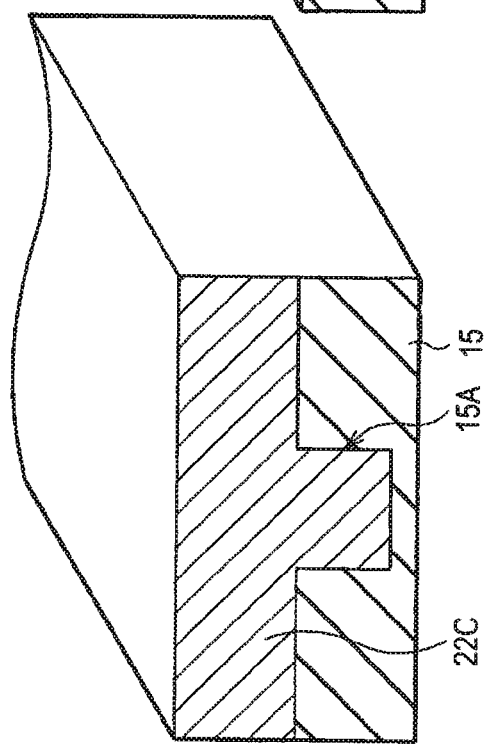

US 9,058,978 B2

MEMORY DEVICE AND METHOD OF MANUFACTURING THE SAME

FIELD

The present disclosure provides a memory device which includes memory elements capable of storing information with changes in the electrical characteristics of a resistance change layer, and a method of manufacturing the same.

BACKGROUND

As a micro memory which has already put into practical use, there is a DRAM (Dynamic RAM) in which one cell has a 1T (Transistor)/1C (Capacitor) structure. At present, using a 40 nm to 30 nm generation process, a product having a cell size of $6F^2$ (F: Feature Size, half pitch of a bit line and a word line) is being mass-produced (for example, see Y. K. Park et al., "Fully Integrated 56 nm DRAM Technology for 1 Gb DRAM", "2007 Symposium on VLSI Technology Digest of Technical Papers", p. 190-191, and Changhyun Cho et al., "A $6F^2$ DRAM Technology in 60 nm era for Gigabit Densities", "2005 Symposium on VLSI Technology Digest of Technical Papers", p. 36-37).

SUMMARY

In recent years, a resistive-change nonvolatile memory (ReRAM: Resistive RAM. An element has a memory function such that an electric field is applied to the element to change resistance, and this state is maintained) which can perform a fast rewrite/read operation and is favorable to miniaturization is being actively developed as the leading candidate for the next-generation memory.

In order for the ReRAM to be arranged in an array and to stably operate, a 1T (Transistor)/1R (Resistance) type memory element in which one cell has one selective element (access transistor) and a resistive-change element is being studied as a basic configuration. The resistive-change element (memory element) has, for example, a configuration in which a memory layer having a memory function with a reversible change in resistance is interposed between an upper electrode and a lower electrode.

When a microcell is realized in a ReRAM, a structure is made in which the above-described 1T/1C DRAM cell is used as a base, and the capacitor portion of the DRAM is substituted with the resistance change layer of the ReRAM. Accordingly, it is expected that it is possible to construct a process flow compatible with the micro DRAM process already mass-produced.

In the case of the DRAM, a single BL (Bit line), a single WL (Word Line), and a cell common plate are connected to a cell. The plate potential is fixed to Vc/2 and the BL is set to either GND or Vc to store 1/0. Incidentally, in the micro generation with a lower voltage, operation is performed under the condition of Vc<3 V or around.

In the case of the ReRAM, it is normally necessary to provide a potential difference equal to or greater than 2 V for a writing operation. In a bipolar type in which the electric field is applied in opposing directions between when high resistance is changed to low resistance and when low resistance is changed to high resistance, as in the DRAM, even if the plate potential is fixed and operation is performed, when Vc<3 V, the potential difference is insufficient, and writing is not performed.

Accordingly, in the bipolar ReRAM, it is necessary to change the potentials on both the upper electrode and the lower electrode with the memory layer interposed therebetween and to secure the potential difference necessary for writing. Meanwhile, since it is difficult to change the potential at high speed if the capacity of the plate is large, it is considered that the memory layer is microfabricated in accordance with the upper electrode, and the plate is divided as the second BL.

However, the memory layer of the ReRAM includes a material which is not easily dry-etched, making it difficult to miniaturize the memory elements.

It is therefore desirable to provide a memory device and a method of manufacturing the same capable of miniaturizing memory elements.

An embodiment of the present disclosure is directed to a memory device including a plurality of memory elements, each having a first electrode, a second electrode, and a memory layer between the first electrode and the second electrode. The plurality of memory layers are in a dotlike pattern. Two adjacent first electrodes share a same memory layer.

In the memory device of the embodiment of the present disclosure, the potentials on both the first bit line and the second bit line are changed to Vc or GND in a complementary manner, such that the voltage +Vc or −Vc is applied between the first electrode of the memory element and the second bit line. Accordingly, the resistance value of the memory layer decreases (low resistance state; written state) or increases (high resistance state; erased state).

Although how the writing operation and the erasure operation correspond to low resistance and high resistance differs depending on the definition, in this specification, the low resistance state is defined as the written state, and the high resistance state is defined as the erased state.

Another embodiment of the present disclosure is directed to a method of manufacturing a memory device. The method includes forming a plurality of memory elements on a semiconductor substrate, each memory element having a first electrode, a second electrode, and a memory layer between the first electrode and the second electrode. The plurality of memory layers are in a dotlike pattern. Two adjacent first electrodes share a same memory layer.

With the memory device according to the embodiment of the present disclosure or the method of manufacturing a memory device according to the embodiment of the present disclosure, two first electrodes are connected to the same first bit line through different adjacent access transistors and share one memory layer, and the one memory layer is connected to a single second bit line, making it possible to simplify the planar shape of the memory layer and to relax the dimension rule. Accordingly, it is not necessary to perform difficult dry etching, and it becomes possible to easily form the memory layer by the filling of the insulating film in the hole and chemical mechanical polishing. Therefore, it becomes possible to miniaturize the memory element.

BRIEF DESCRIPTION OF THE DRAWINGS

FIGS. 15A to 15D are perspective views illustrating a method of forming a memory layer.

DETAILED DESCRIPTION

Hereinafter, embodiments of the present disclosure will be described in detail with reference to the drawings. The description will be provided in the following sequence.

1. First Embodiment (an example when an upper electrode is provided directly on a memory layer)
2. Second Embodiment (an example where an insulating film is provided on a memory layer, and an upper electrode is connected to the memory layer through a hold formed in the insulating film)
3. Third Embodiment (an example of a PCM)
4. Fourth Embodiment (an example of a ReRAM)

(First Embodiment)

Figure 1:
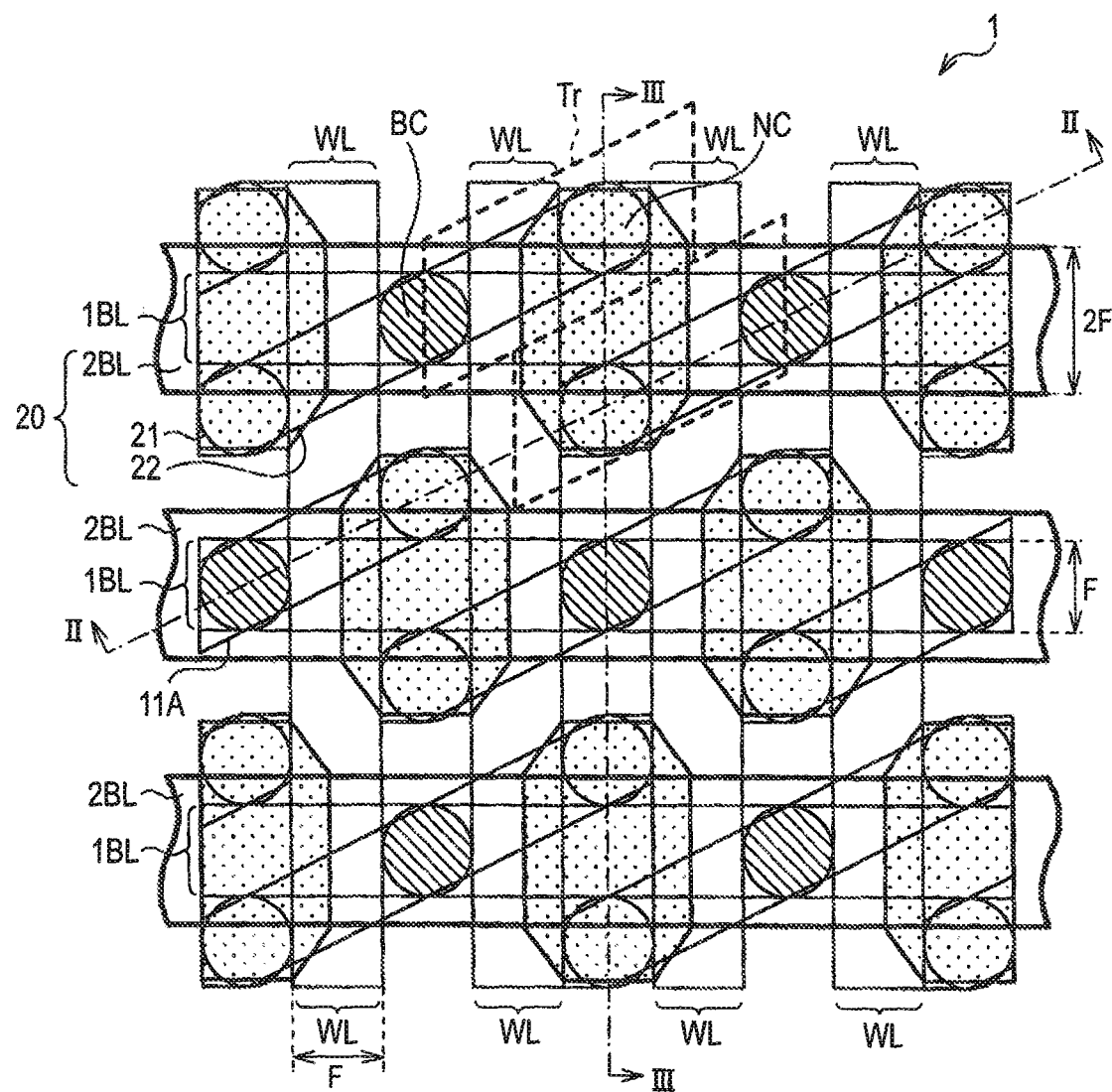
FIG. 1 is a plan view showing the configuration of a memory device according to a first embodiment of the present disclosure.

FIG. 1 shows the planar configuration of a memory device according to a first embodiment of the present disclosure.

Figure 2:
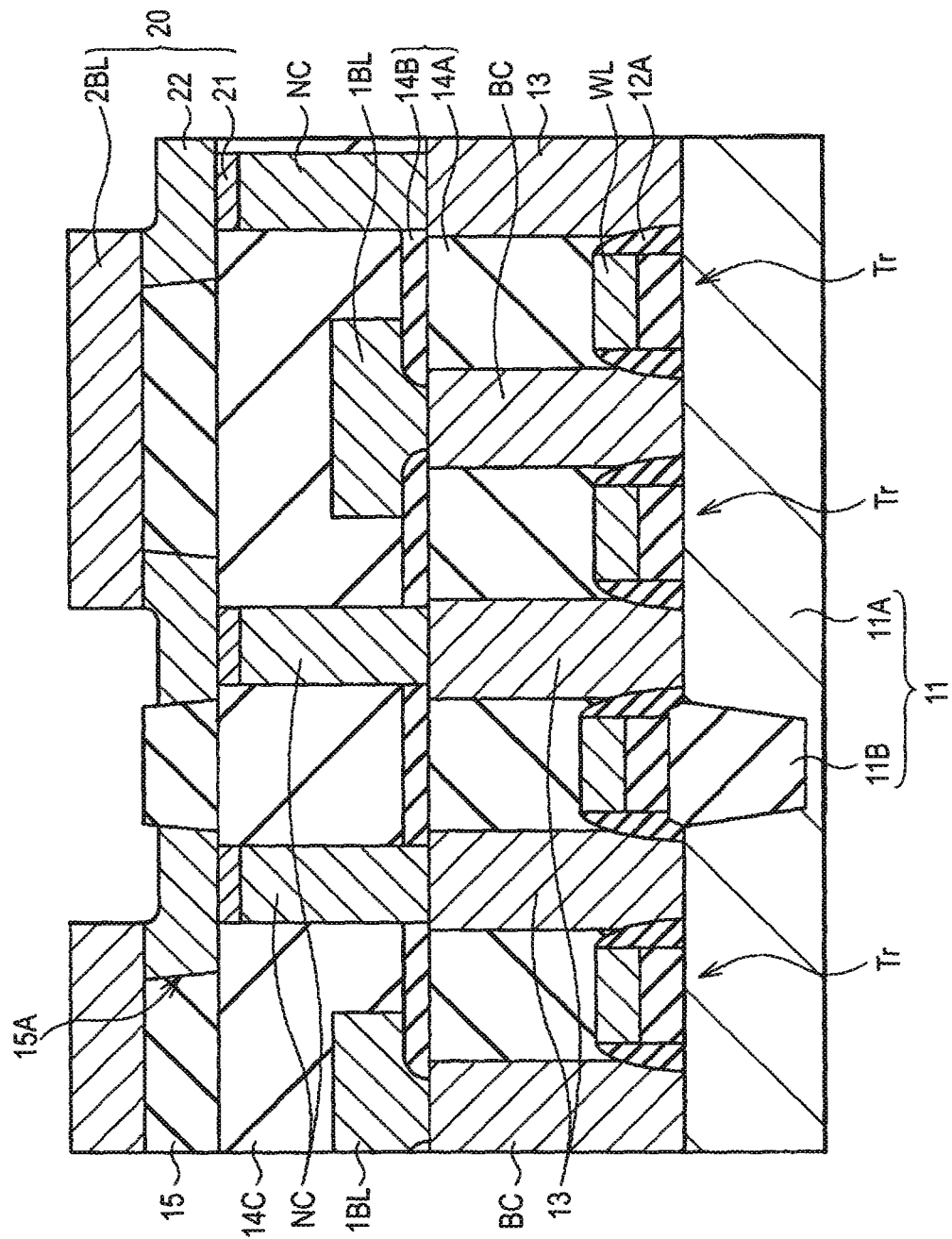
FIG. 2 is a sectional view taken along the line II-II of FIG. 1.
Figure 3:
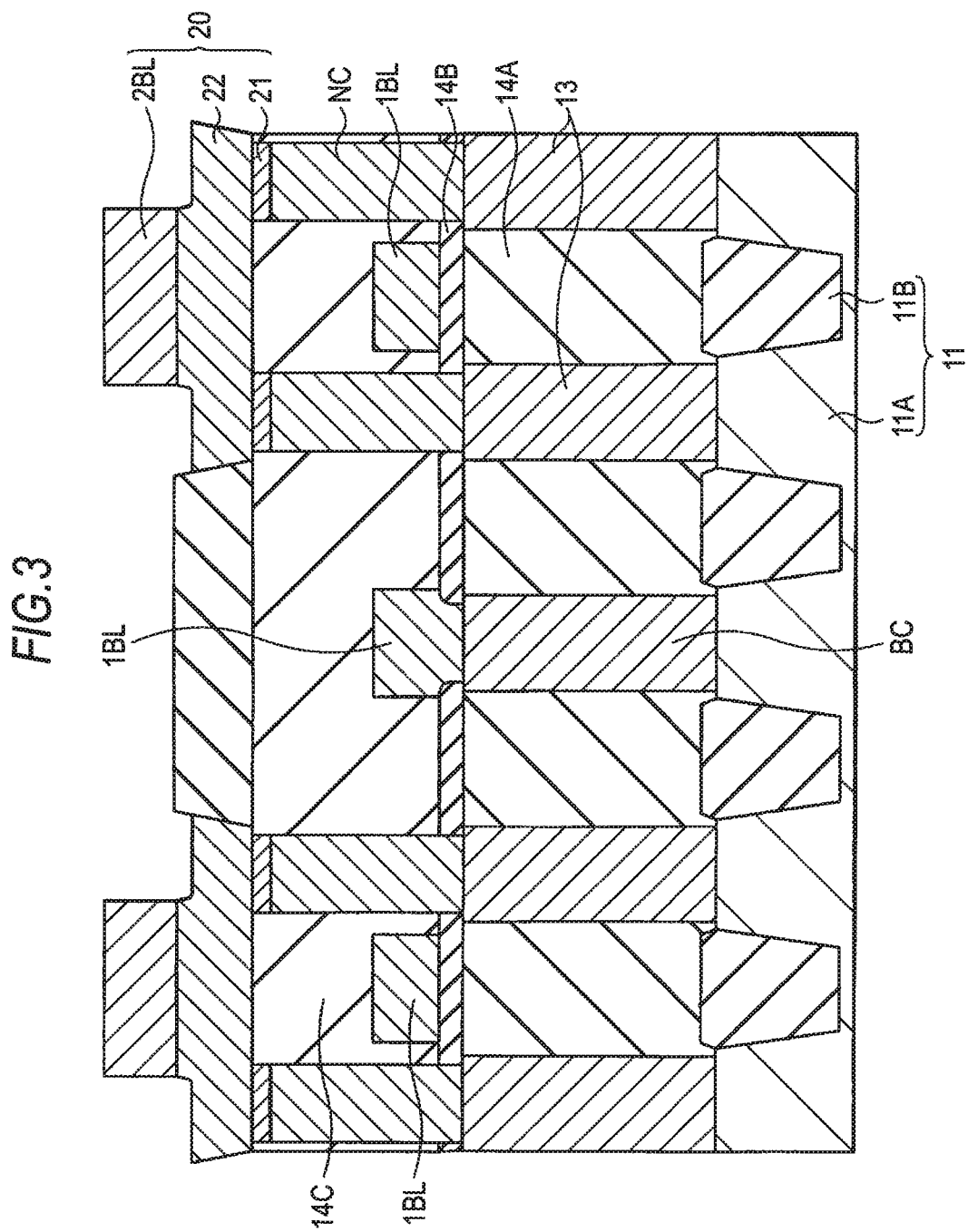
FIG. 3 is a sectional view taken along the line III-III of FIG. 1.
Figure 4:
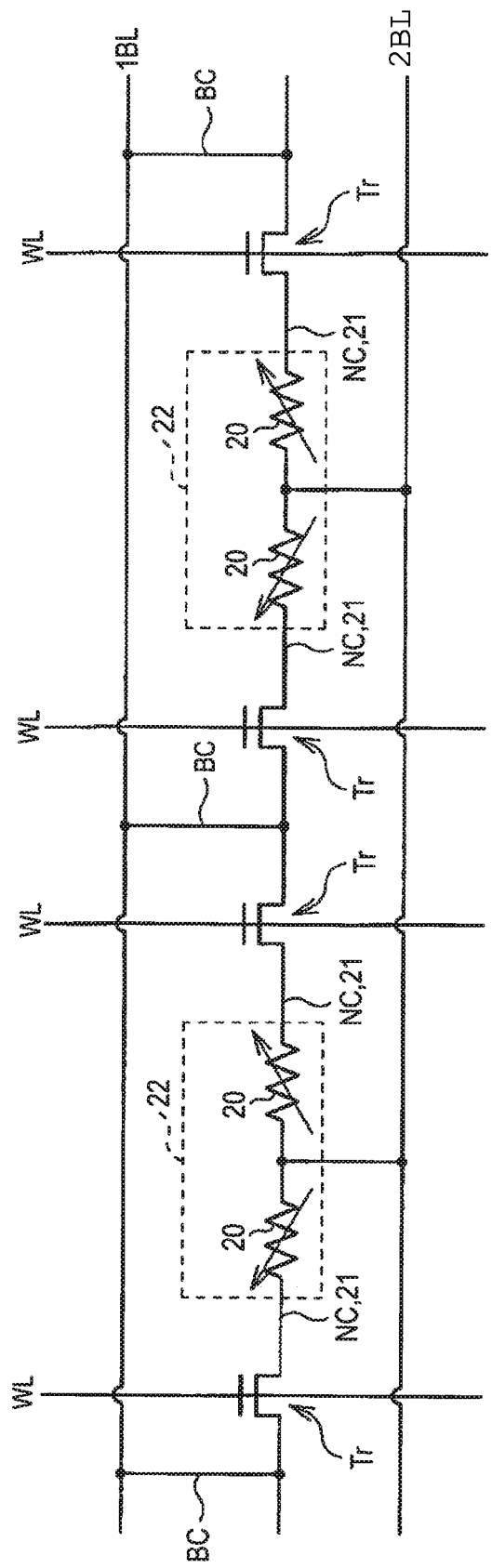
FIG. 4 is an equivalent circuit diagram of the memory device shown in FIG. 1.

FIG. 2 shows the sectional configuration along the line II-II of FIG. 1. FIG. 3 shows the sectional configuration along the line III-III of FIG. 1. FIG. 4 shows an equivalent circuit of a memory device 1. The memory device 1 has, on a substrate 11, a plurality of access transistors Tr and a plurality of memory elements 20. As shown in FIG. 4, the gate of each access transistor Tr is connected to a word line WL. As shown in FIG. 4, one of the source and the drain of the access transistor Tr is connected to a first bit line 1 BL through a bit contact electrode BC. As shown in FIG. 4, the other of the source and the drain of the access transistor Tr is connected to a first electrode (lower electrode) 21 of the memory element 20 through a node contact electrode NC.

The substrate 11 is, for example, a silicon (Si) substrate, and a diffusion layer (active region) 11A of the access transistor Tr is provided in the surface of the substrate 11. The diffusion layers 11A are isolated by an element isolation layer 11B.

The word lines WL are arranged on the substrate 11, for example, in the vertical direction in FIG. 1. As shown in FIGS. 2 and 3, the side of each word line WL is covered with an insulating layer 12A.

The first bit lines 1 BL are provided in a direction perpendicular to the word lines WL, for example, in the horizontal direction of FIG. 1. As shown in FIG. 4, two access transistors Tr are connected to the first bit line 1 BL with the bit contact electrode BC interposed therebetween.

The width of each of the word line WL and the first bit line 1 BL is equal to the minimum dimension rule (the fabrication limit by photolithography) F, the pitch of the first bit lines 1 BL is three times (3F) greater than the minimum dimension rule F, and the pitch of the word lines WL is two times (2F) greater than the minimum dimension rule F.

The bit contact electrode BC connects the first bit line 1 BL and the diffusion layer 11A of the access transistor Tr, and as shown in FIG. 1, is provided to overlap the first bit line 1 BL between two adjacent word lines WL.

The node contact electrode NC connects the first electrode 21 of the memory element 20 and the diffusion layer 11A of the access transistor Tr, and as shown in FIG. 1, and is provided to overlap the first electrode 21 on the opposite side to the bit contact electrode BC with each of the two adjacent word lines WL, which are arranged with the bit contact electrode BC interposed therebetween, interposed therebetween. As shown in FIGS. 2 and 3, a connection plug 13 is provided between the node contact electrode NC and the diffusion layer 11A.

The bit contact electrode BC is shared by two adjacent access transistors Tr, and one node contact electrode NC is provided in each access transistor Tr. Accordingly, as schematically surrounded by a dotted line in FIG. 1, one access transistor Tr is a parallelogram region including half of one bit contact electrode BC and one node contact electrode NC. The area per access transistor Tr is $6F^2$, and a very high-density arrangement is made.

As shown in FIGS. 2 and 3, the bit contact electrode BC and the connection plug 13 are separated from each other by an insulating interlayer 14A. As shown in FIGS. 2 and 3, the first bit line 1 BL is connected to the bit contact electrode BC through a contact hole provided in an insulating interlayer 14B. As shown in FIGS. 2 and 3, the node contact electrode NC and the first bit line 1 BL are separated from each other by an insulating interlayer 14C.

The memory element 20 is arranged for each of a plurality of access transistors Tr, and has a memory layer 22 between the first electrode (lower electrode) 21 and a second bit line 2

BL. The first electrode 21, the memory layer 22, and the second bit line 2 BL are laminated in that order from the substrate 11 side.

The first electrode 21 is provided on, for example, the node contact electrode NC for each of a plurality of access transistors Tr. As shown in FIGS. 2 and 4, the first electrode 21 is connected to the first bit line 1 BL through the node contact electrode NC and the access transistor Tr. The first electrode 21 is made of an interconnect material which is used in a semiconductor process, for example, W (tungsten), WN (tungsten nitride), titanium (Ti), titanium nitride (TiN), or tantalum nitride (TaN).

The second bit line 2 BL has a function as a second electrode (upper electrode) relative to the first electrode (lower electrode) 21, and is provides as a plurality of parallel linear electrodes extending in the same direction as the first bit line 1 BL. Similarly to the first electrode 21, the second bit line 2 BL is made of an interconnect material which is used in a known semiconductor process, for example, tungsten (W).

Figure 5:
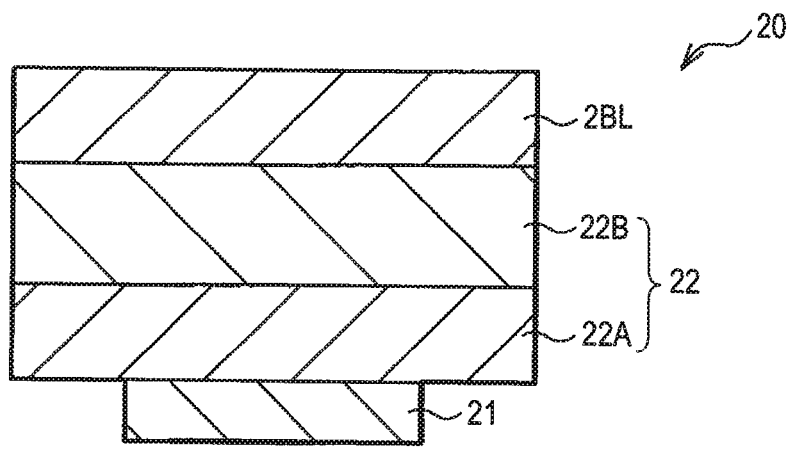
FIG. 5 is a sectional view showing an example of a memory layer shown in FIG. 2.

FIG. 5 shows an example of the memory layer 22. In the memory layer 22, the resistance value reversibly changes with voltage application. For example, the memory layer 22 has a configuration in which a resistance change layer 22A and an ion source layer 22B are laminated in that order from the first electrode 21 side.

The ion source layer 22B includes at least one chalcogen element selected from a group consisting of tellurium (Te), sulfur (S), and selenium (Se) as an anionic ion conductive material. The ion source layer 22B includes one metal element or two or more metal elements of silver (Ag), copper (Cu), zinc (Zn), and the like as a cationic element. The metal element and the chalcogen element are coupled to form metal chalcogenide. This metal chalcogenide primarily has an amorphous structure, and serves as an ion supply source.

The cationic metal element is reduced on the first electrode 21 during a writing operation to form a metallic conduction path (filament). Accordingly, it is preferable that the cationic metal element is a chemically stable element which exists in a metallic state in the ion source layer 22B including the above-described chalcogen element. Examples of the metal element include, in addition to the above-described metal elements, for example, transition metals of the 4A, 5A, 6A groups of on the periodic table, that is, Ti, zirconium (Zr), hafnium (Hf), vanadium (V), niobium (Nb), tantalum (Ta), chromium (Cr), molybdenum (Mo), and W. One of these elements or two or more elements may be used. The ion source layer 22B may include additive elements, such as aluminum (Al), germanium (Ge), and silicon (Si). Examples of a specific composition of the ion source layer 22B include ZrTeAl, TiTeAl, CrTeAl, WTeAl, and TaTeAl.

The resistance change layer 22A is made of a material having a resistance value greater than the ion source layer 22B, and has a function as an electrical conductive barrier. In the resistance change layer 22A, the resistance value changes when a predetermined voltage is applied between the first electrode 21 and the second bit line 2 BL. As the material for the resistance change layer 22A, any material may be used insofar as the material is an insulator or a semiconductor which is stable even when being in contact with the ion source layer 22B. Specific examples of the material of the resistance change layer 22A include a rare-earth element, such as gadolinium (Gd), an oxide, a nitride, or a fluoride including at least one of Al, magnesium (Mg), Ta, Si, and the like, and the like. A compound including a chalcogen element of Te, S, Se, or the like acting as an anionic component may be used. Specifically, for example, when Te is used, AlTe, MgTe, ZnTe, AlTeN including nitrogen (N), or the like may be used.

The above-described configuration and the material of the memory layer 22 are just an example, and other configurations maybe made or other materials maybe used. For example, the memory layer 22 may have a single layer, or may have two or more layers. The number of constituent elements of the memory layer 22 or the kinds of the constituent elements is not limited.

As shown in FIG. 1, the memory layer 22 is provided in a dotlike pattern covering two adjacent first electrodes 21 in a direction parallel to the extension direction of the word line WL. That is, two first electrodes 21 are connected to the same first bit line 1 BL through different adjacent access transistors Tr and share one memory layer 22. The one memory layer 22 is connected to the single second bit line 2 BL. Accordingly, in this memory device 1, the miniaturization of the memory element 20 is possible.

Figure 6:
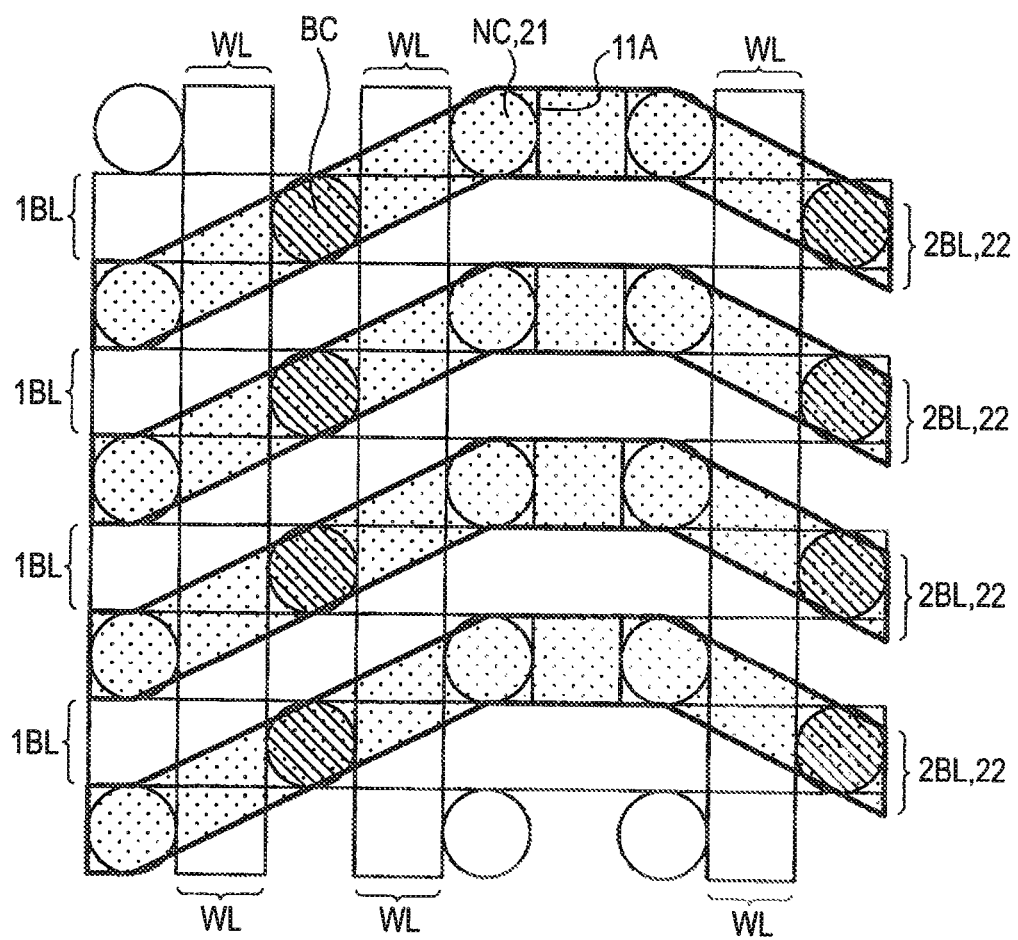
FIG. 6 is a plan view showing the configuration of a memory device according to Reference Example 1 of the present disclosure.
Figure 7:
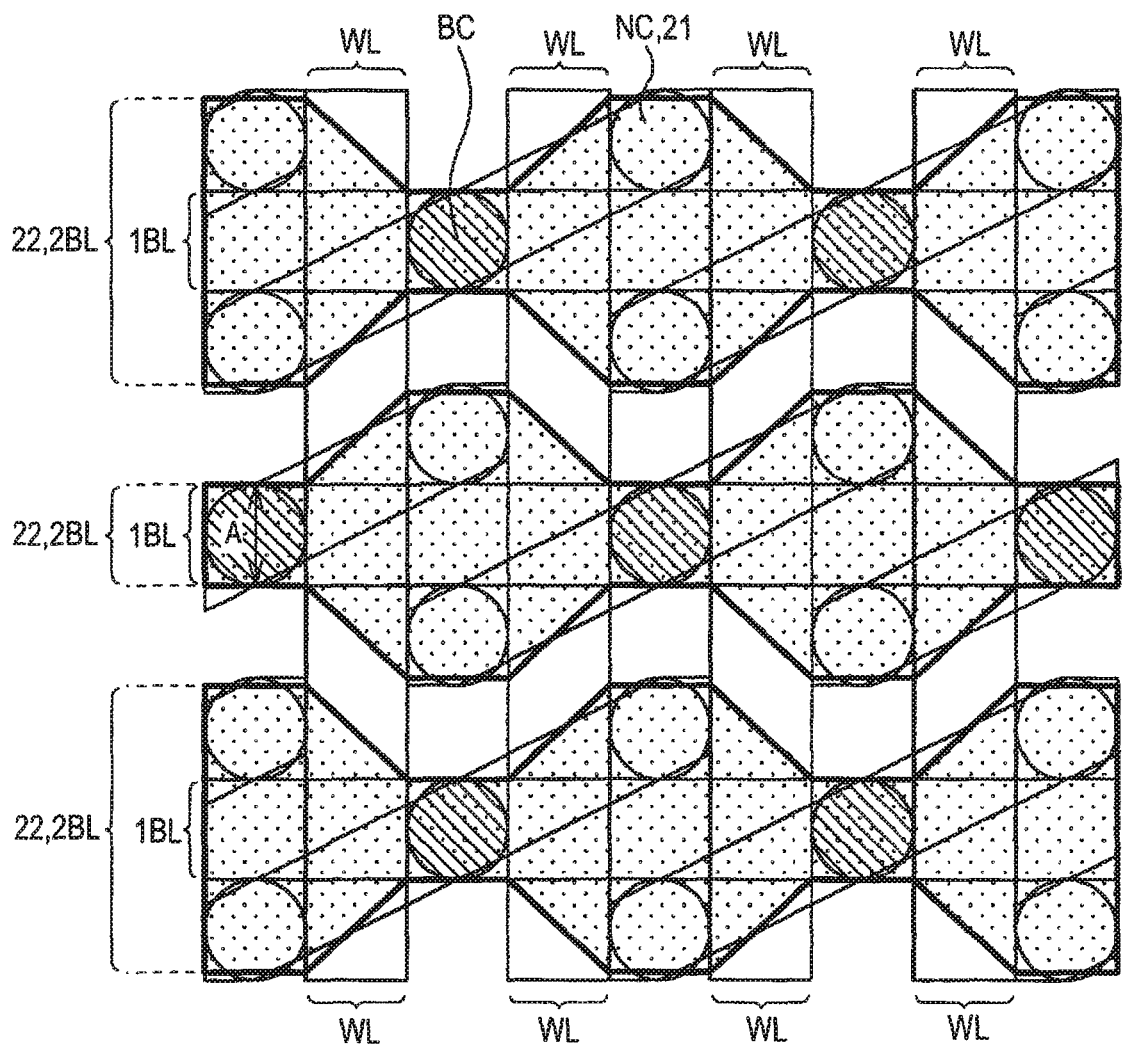
FIG. 7 is a plan view showing the configuration of a memory device according to Reference Example 2 of the present disclosure.

Hereinafter, this will be described in detail. As described above, in the resistive-change memory element 20, in order to secure the potential difference necessary for writing, it is necessary to divide the plate as the second bit line in the DRAM. FIGS. 6 and 7 show a reference example where the memory layer 22 has the same planar shape as the second bit line 2 BL. In FIG. 6, the memory layer 22 and the second bit line 2 BL are provided in a zigzag pattern having a uniform width along the planar shape of the access transistor Tr, and the L/S (Line and Space) pattern of the minimum dimension rule is applied in all parts. In FIG. 7, the memory layer 22 and the second bit line 2 BL cover all the bit contact electrodes BC and the node contact electrodes NC accompanied by the same first bit line 1 BL. For this reason, while the dimension rule is partially relaxed in the vicinity of the node contact electrode NC, the minimum dimension rule is applied in the vicinity of the bit contact electrode BC.

As described above, the memory layer 22 is made of a complex combination of elements including a material, such as copper (Cu), which is not easily dry-etched. For this reason, similarly to the copper (Cu) interconnect, when the memory element 20 is fabricated in the fine generation, it is advantageous that a damascene process is used in which the material of the memory layer 22 is filled in the groove of the insulating film, and the material extruded from the groove is removed by chemical mechanical polishing (CMP), compared to dry etching of the material.

However, when forming a complex pattern with the application of the minimum dimension rule, even if a damascene process is used, the degree of difficulty is high because of patterning by lithography, filling after groove fabrication, security of uniformity of CMP, and the like.

For example, in FIG. 6, while the pattern is repeated uniformly, the L/S pattern of the minimum dimension rule is applied in all parts, making it difficult to secure the yield of filling and CMP.

In FIG. 7, while the dimension rule is partially relaxed in the vicinity of the node contact electrode NC, it is necessary to fill a portion (a portion marked with an arrow A in FIG. 7) having the width of the minimum dimension rule in the vicinity of the bit contact electrode BC. This makes fabrication difficult. It is also necessary to fill a wide portion and a narrow portion simultaneously, and to perform CMP, making it difficult to adjust the conditions. Since the pattern is not a simple repetitive pattern, a process window in lithography is narrow.

The material of the memory layer 22 has excessively high resistance for general use as a bit line interconnect. For this reason, a backing interconnect should be further formed of a material having low resistance, causing an increase in the number of processes.

Figure 8:
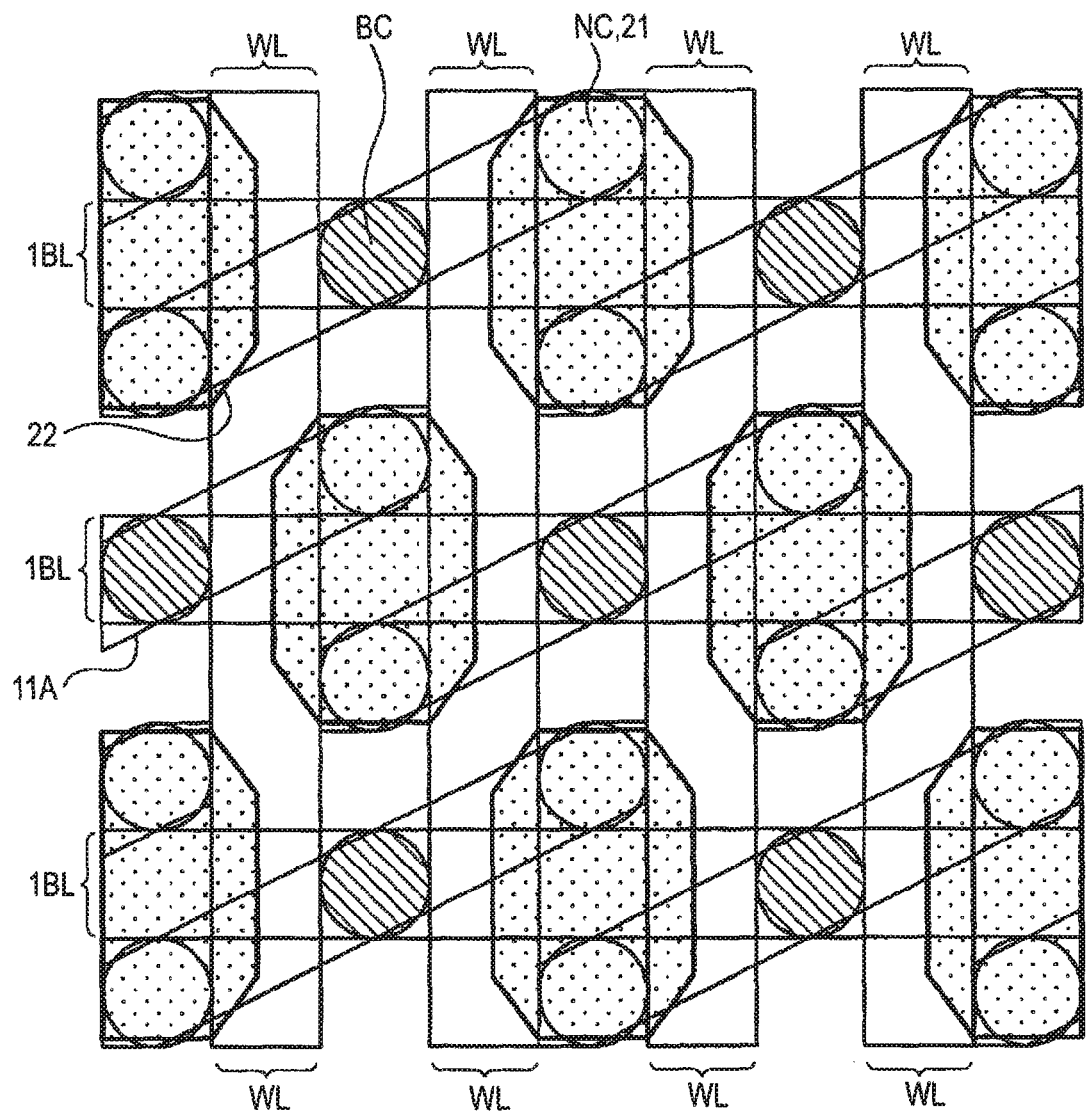
FIG. 8 is a plan view illustrating the shape of a memory layer.

In this embodiment, as shown in FIG. 8, a narrow portion of the memory layer 22 in the vicinity of the bit contact electrode BC is removed, and a dotlike pattern is formed. Accordingly, it becomes possible to simplify the planar shape of the memory layer 22 and to relax the dimension rule. Therefore, in a manufacturing process described below, it is not necessary to perform difficult dry etching, making it possible to more easily form the memory layer 22 by the filling of the insulating film into the hole and CMP.

Since the memory layer 22 is divided for every two memory elements 20, it is necessary to connect the divided memory layers 22 by the second electrode (upper electrode) to form the second bit line 2 BL. Accordingly, in this embodiment, as shown in FIG. 1, the single second bit line 2 BL is connected to one memory layer 22. Therefore, it becomes possible to form the second bit line 2 BL in a simple L/S pattern and to electrically connect the memory layer 22 and the second bit line 2 BL. It becomes possible to increase the width of the second bit line 2 BL, for example, about two times (2F) greater than the minimum dimension rule.

For the second electrode (upper electrode) or the second bit line 2 BL, in order to realize high-speed operation, similarly to the backing interconnect of the related art, a material having somewhat low resistance is necessary. Meanwhile, for the second electrode (upper electrode) or the second bit line 2 BL, it is not necessary to use a material, such as copper (Cu), which is not easily etched. It is possible to form the second electrode (upper electrode) or the second bit line 2 BL of an interconnect material, such as tungsten (W), which can be normally dry-etched.

As shown in FIGS. 2 and 3, the memory layer 22 is filled in a hole 15A provided in the insulating film 15 on the first electrode 21. The insulating film 15 may be made of, for example, a silicon oxide film or a silicon nitride film which is used in a normal semiconductor process. Considering the filling of the memory layer 22 in a manufacturing process described below, it is desirable that the thickness of the insulating film 15 is suppressed to be slightly greater than the minimum dimension rule in this generation.

The memory device 1 can be manufactured, for example, in the following manner.

FIGS. 9 to 17 show a method of manufacturing the memory device 1 in a process sequence. First, the element isolation layer 11B is formed on the substrate 11 made of silicon by a normal LSI (Large Scale Integrated circuit) process, and a plurality of access transistors Tr and transistors constituting peripheral circuits (not shown) are then formed. At this time, the gate of the access transistor Tr becomes the word line WL. The side of the word line WL is covered with the insulating layer 12A.

Subsequently, the insulating interlayer 14A is formed on the access transistor Tr, and a contact hole is provided in the insulating interlayer 14A and filled with, for example, a conductive material, such as polysilicon including phosphorus (P) to form the bit contact electrode BC and the connection plug 13.

Figure 9:
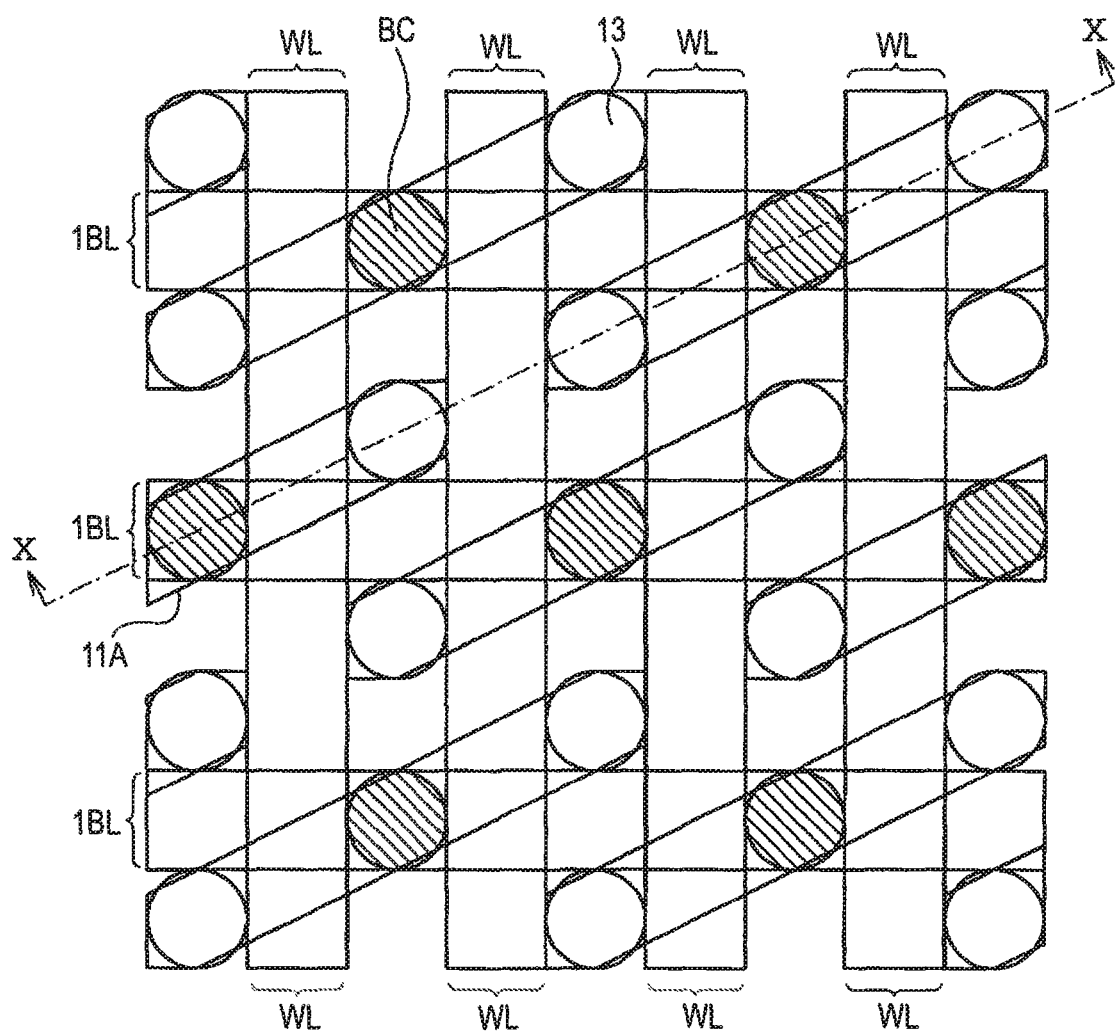
FIG. 9 is a plan view showing a method of manufacturing the memory device shown in FIG. 1 in a process sequence.
Figure 10:
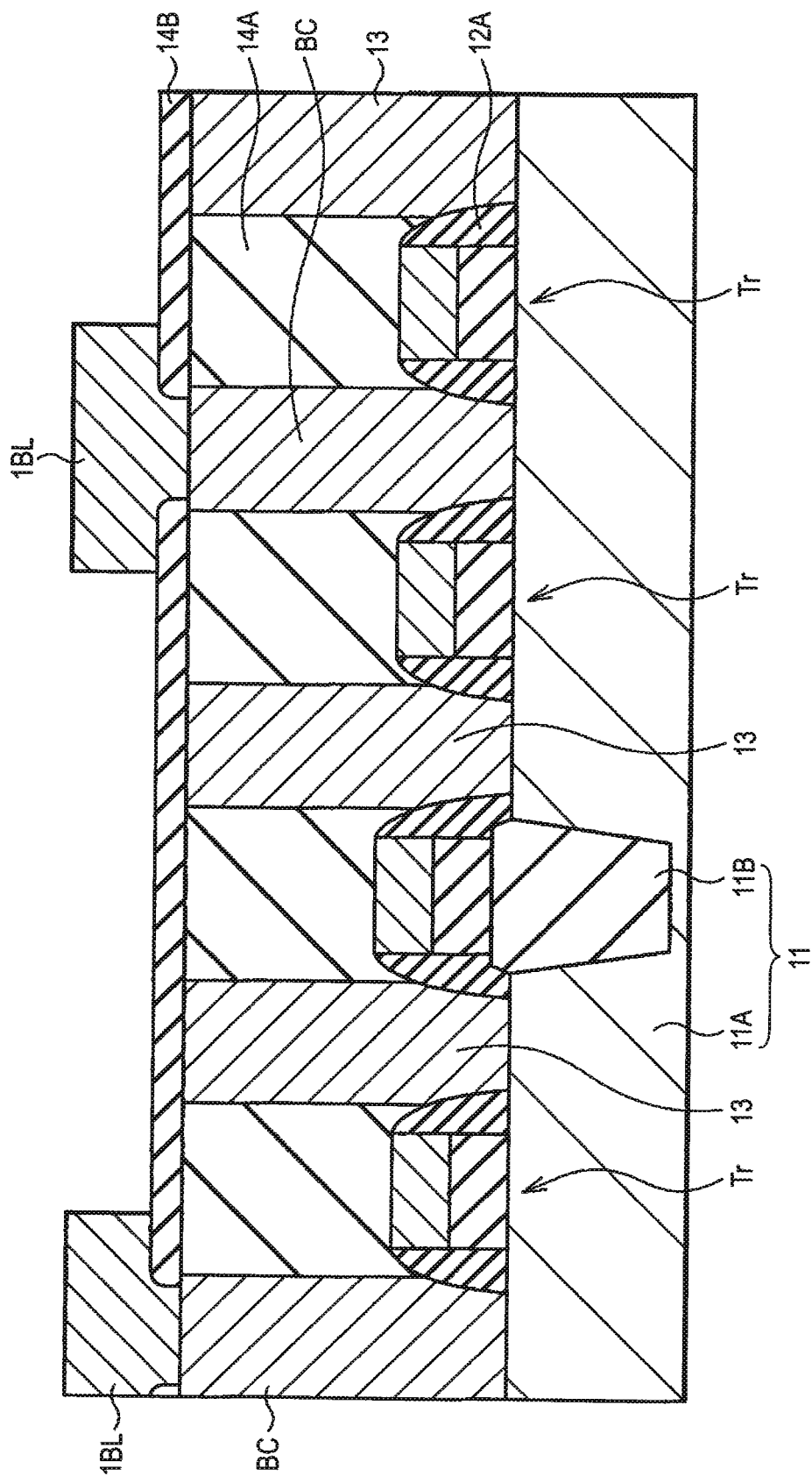
FIG. 10 is a sectional view taken along the line X-X of FIG. 9.

Thereafter, the insulating interlayer 14B is formed on the insulating interlayer 14A, the bit contact electrode BC, and the connection plug 13, and a contact hole is provided in the insulating interlayer 14B. Subsequently, a conductive material film, such as tungsten (W), is formed and etched. Thus, as shown in FIGS. 9 and 10, the first bit line 1 BL is formed on the bit contact electrode BC.

Figure 11:
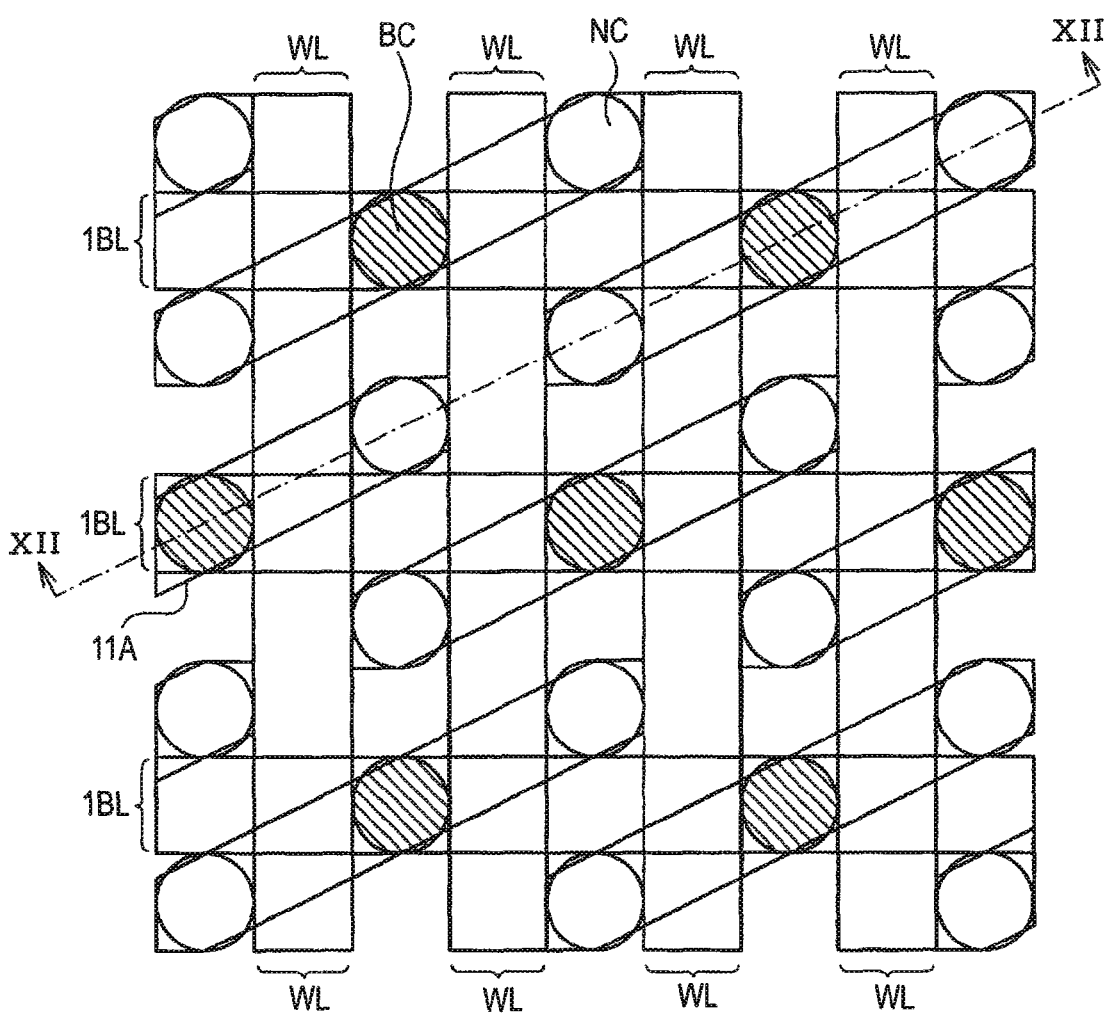
FIG. 11 is a plan view showing a process subsequent to FIG. 9.
Figure 12:
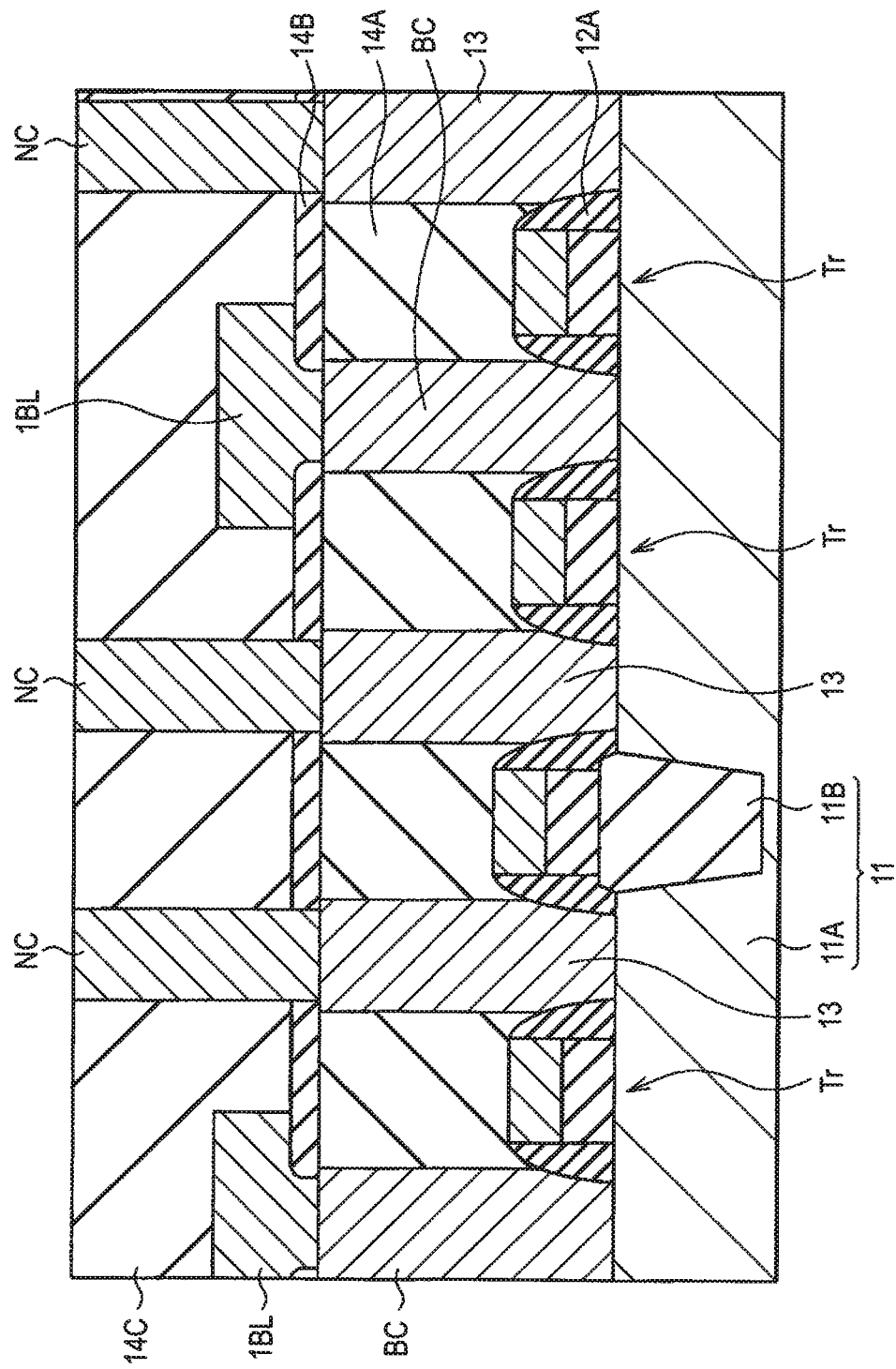
FIG. 12 is a sectional view taken along the line XII-XII of FIG. 11.

Subsequently, as shown in FIGS. 11 and 12, the insulating interlayer 14C is formed on the first bit line 1 BL and the insulating interlayer 14B, and a contact hole is provided in the insulating interlayer 14C and filled with a conductive material. Thus, the node contact electrode NC is formed on the connection plug 13. In the above manufacturing process, the flow of a normal COB (Capacitor Over Bit Line) DRAM process may be used.

Figure 13:
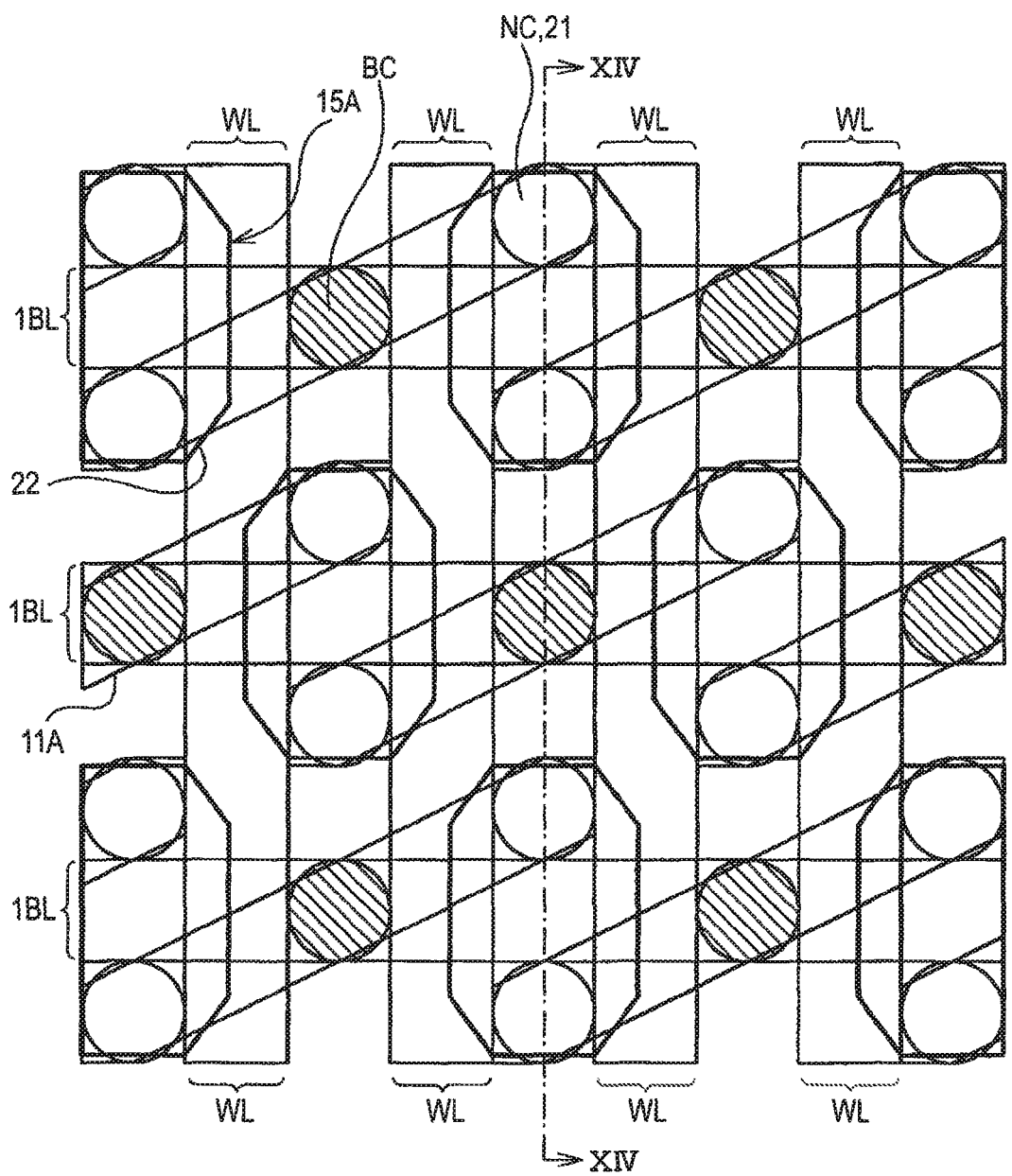
FIG. 13 is a plan view showing a process subsequent to FIG. 11.
Figure 14:
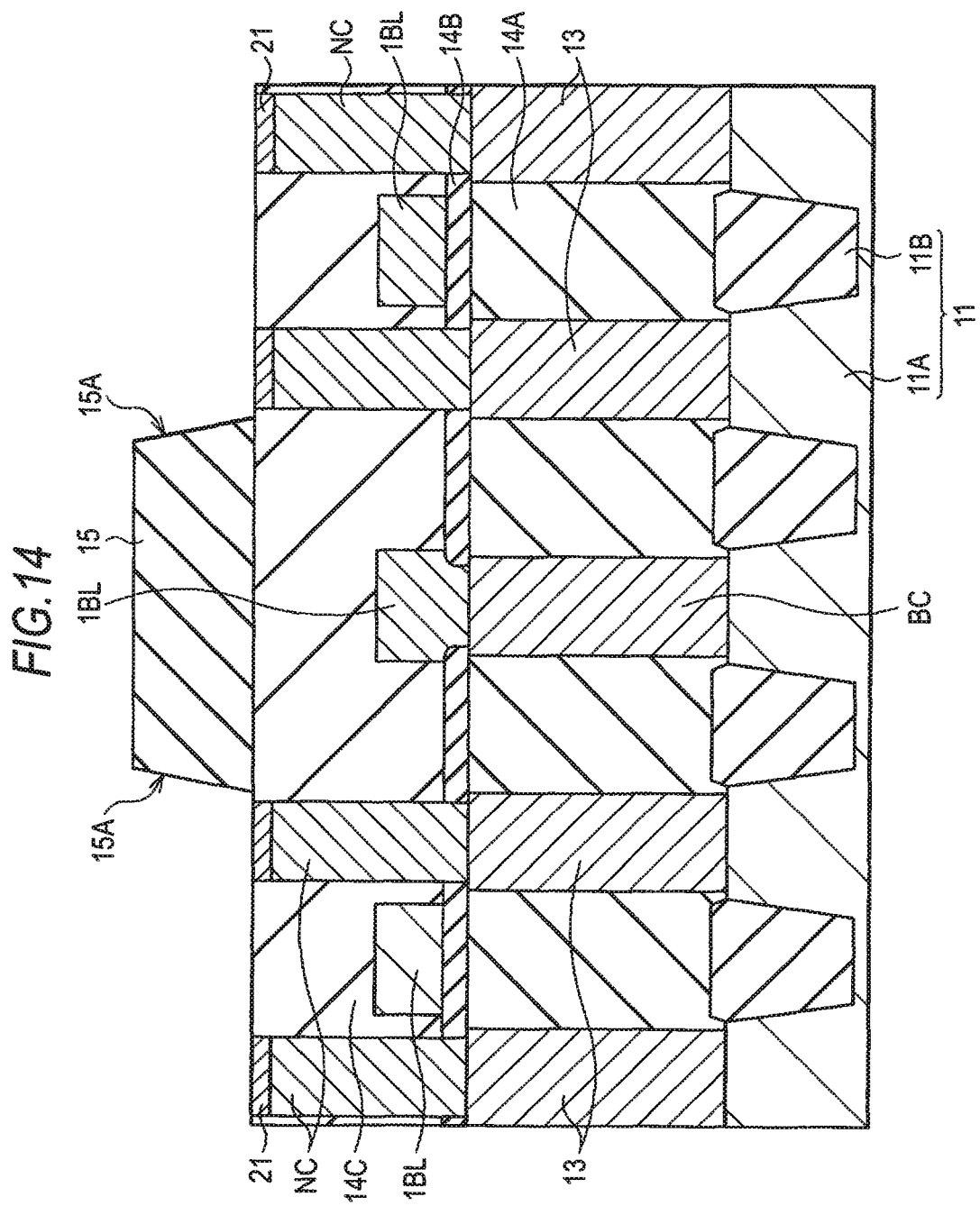
FIG. 14 is a sectional view taken along the line XIV-XIV of FIG. 13.

Thereafter, as shown in FIGS. 13 and 14, the first electrode 21 is formed on the node contact electrode NC. As the method, there is a method in which a fine hole is formed on the node contact electrode NC to fill the first electrode 21, a method in which a conductive layer (for example, or a metal silicide layer) is formed on the node contact electrode NC in a self-alignment manner. FIG. 14 shows the latter case. As shown in FIGS. 11 and 12, if a filling material of the node contact electrode NC can be used directly, this process is not necessary.

Subsequently, as shown in FIGS. 13, 14, and 15A, the insulating film 15 is formed on the first electrode 21 and the insulating interlayer 14C. As shown in FIG. 15B, the holes 15A are provided in the insulating film 15 in a dotlike pattern. In the hole 15A, two first electrodes 21 connected to the same first bit line 1 BL through different adjacent access transistors Tr are exposed. In other words, in the hole 15A, two adjacent first electrodes 21 in a direction parallel to the extension direction of the word line WL are exposed. Since the holes 15A are provided in a simple repetitive pattern, it becomes easy to use the light interference effect and to secure the exposure margin of lithography.

After the hole 15A is provided in the insulating film 15, the surface treatment (for example, sputter etch cleaning) of the first electrode 21 in the hole 15A is performed, and as shown in FIG. 15C, a memory layer material film 22C is formed on the entire surface of the insulating film 15. The method of forming the memory layer material film 22C is not particularly limited, and the memory layer material film 22C may be formed by a CVD (Chemical Vapor Deposition) method or a sputtering method.

In the case of the sputtering method, since the hole 15A can be filled with high coatability, a directional sputtering method, a bias sputtering method, or a high-temperature sputtering method may also be considered.

The directional sputtering method is a sputtering method in which the distance between a sputter target made of the material for the memory layer 22 and the substrate is extended, the expected angle of the target when viewed from the substrate is narrowed, and the pressure decreases to reduce scattering halfway, thereby improving the deposition efficiency of sputter particles to the dot bottom.

The bias sputtering method is a sputtering method in which a bias is also applied to the substrate to input ionized sputter gas, such as Ar+, and deposition is performed while partially cutting the material of the memory layer 22 deposited in the shoulder portion of the hole 15A. The amount of the material to be deposited in the shoulder portion of the hole 15A increases.

The high-temperature sputtering method is a sputtering method in which sputter deposition is performed while heating the substrate to a temperature close to the melting point of the material, and the sputter material once attached to the substrate surface flows to fill the hole 15A. This method is easily applied since there are many cases where the material of the memory layer 22 includes metal having a low melting point. Alternatively, deposition may be performed by a normal sputtering method, and heating may be then performed such that the material reflows.

In this embodiment, since the memory layer material film 22C fills the hole 15A surrounding the two first electrodes 21 together, it is not necessary to fill the hole 15A at the width of the minimum dimension rule. If the depth of the hole 15A is slightly smaller than the minimum dimension rule, the aspect ratio (the depth of the hole 15A/the width of the hole 15A) can be suppressed to be equal to or smaller than 1, and the hole 15A may be filled by any method described above.

In order to deposit a plurality of materials, Co-sputtering in which simultaneous sputter deposition from a plurality of targets is performed, a method which uses an alloy target formed of a plurality of materials from the beginning, reactive sputtering in which, when oxygen or nitrogen is not contained, deposition is performed in the gas atmosphere or in a mixed gas atmosphere including Ar gas may be combined.

Figure 16:
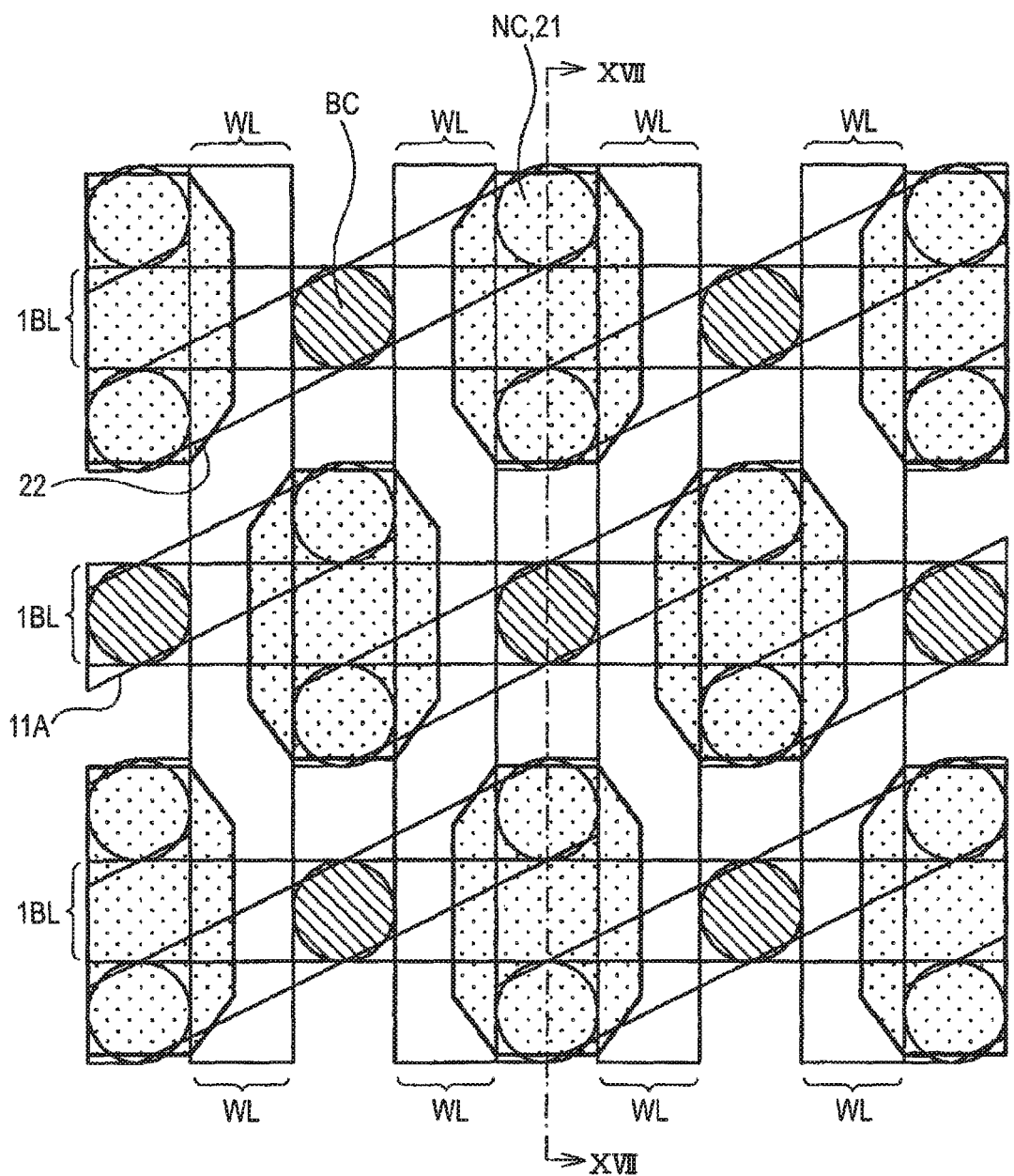
FIG. 16 is a plan view showing a process subsequent to FIG. 13.
Figure 17:
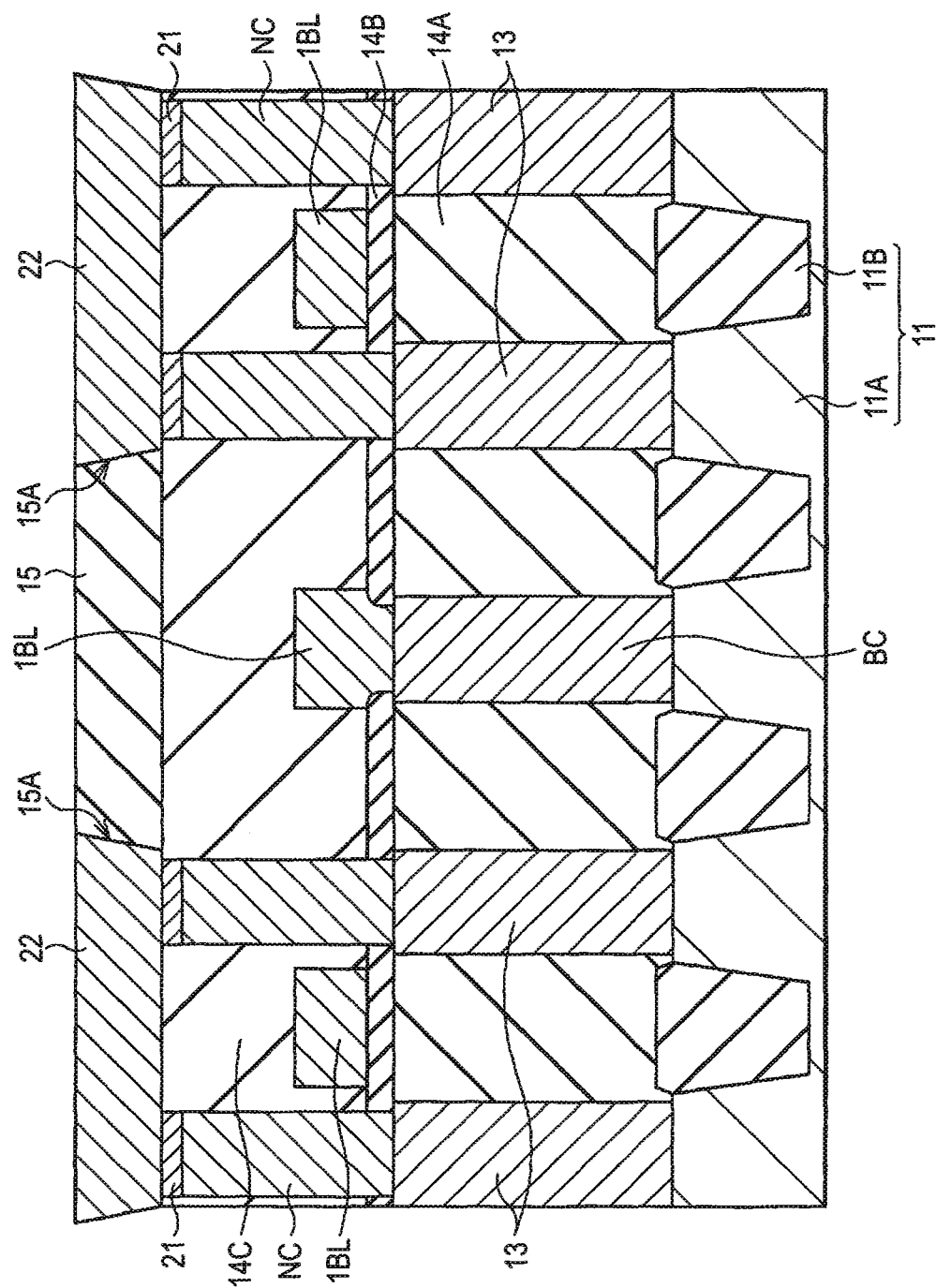
FIG. 17 is a sectional view taken along the line XVII-XVII of FIG. 16.

After the hole 15A is filled with the memory layer material film 22C, as shown in FIG. 15D, the memory layer material film extruded from the hole 15A is removed by CMP (chemical mechanical polishing). Thus, as shown in FIGS. 16 and 17, the memory layer 22 is formed in the hole 15A. Since the holes 15A are provided in a simple repetitive pattern, it becomes easy to suppress or optimize local variations in the polishing rate or dishing, making it possible to secure a sufficient process margin.

After the memory layer 22 is formed, a conductive film (not shown) for forming the second bit line 2 BL is formed on the memory layer 22. The conductive film may be a single-layered film or a laminated film made of a material, such as tungsten (W), which is easy to fabricate for use in a normal semiconductor process. While the deposition method uses normal sputter deposition, the method is not particularly limited. Since the conductive film also serves as the upper electrode of the memory element 20, pretreatment, such as etching, may be performed such that the conductive film is in contact with the upper surface of the memory layer 22.

After the conductive film is formed on the memory layer 22, the conductive film is fabricated in the pattern of the second bit line 2 BL serving as the second electrode (upper electrode) by, for example, lithography and etching. The formed pattern of the second bit line 2 BL may be a simple L/S pattern having a pitch looser than the minimum dimension rule, and can be comparatively easily realized.

Finally, the second bit line 2 BL is covered with an insulating film (not shown), a contact hole (not shown) for connection to an upper interconnect layer (not shown) is formed, and a circuit pattern (not shown) is formed in a form based on a normal semiconductor interconnection process. With the above, the memory device 1 shown in FIGS. 1 to 4 is completed.

In the memory device 1, the potentials on both the first bit line 1 BL and the second bit line 2 BL change to Vc or GND in a complementary manner, such that the voltage +Vc or −Vc is applied between the first electrode 21 of the memory element 20 and the second bit line 2 BL from a power supply (pulse application unit) (not shown). Accordingly, the electrical characteristic of the memory layer 22, for example, the resistance value changes, thereby writing and erasing information. Hereinafter, this operation will be specifically described.

First, a positive voltage is applied to the memory element 20 such that the second bit line 2 BL is at a positive potential and the first electrode 21 is at a negative potential. Accordingly, in the memory layer 22, cations, such as Cu and/or Zr, are ionically conducted from the ion source layer 22B and coupled to electrons and educed on the lower electrode 21 side. As a result, a conduction path (filament) of Zr and/or Cu having low resistance reduced in a metallic state is formed in the boundary between the first electrode 21 and the resistance change layer 22A. Otherwise, a conduction path is formed in the resistance change layer 22A. Accordingly, the resistance value of the resistance change layer 22A decreases, and the high resistance state in the initial state is changed to the low resistance state.

Thereafter, even if the positive voltage is removed to eliminate a voltage applied to the memory element 20, the low resistance state is held. Accordingly, information is written. When this is used in a once-writable memory device, a so-called PROM (Programmable Read Only Memory), recording is completed only by the above-described recording process.

When applying to an erasable memory device, that is, a RAM (Random Access Memory), an EEPROM (Electronically Erasable and Programmable Read Only Memory), or the like, an erasure process is necessary. In the erasure process, a negative voltage is applied to the memory element 20 such that the second bit line 2 BL is at a negative potential and the first electrode 21 is at a positive potential. Accordingly, Zr and/or Cu of the conduction path formed in the resistance change layer 22 is oxidized and ionized, molten in the ion source layer 22B or coupled to Te or the like to form a compound, such as $Cu_2Te$ or CuTe. When this happens, the conduction path of Zr and/or Cu disappears or decreases, and the resistance value increases. Alternatively, the additive element of Al, Ge, or the like in the ion source layer 22B forms an oxide film on the anode, and the resistance state changes to the high resistance state.

Thereafter, even if the negative voltage is removed to eliminate a voltage applied to the memory element 20, the state where the resistance value has increased is held. Accordingly, it becomes possible to erase written information. This process is repeated, thereby repeatedly writing and erasing information in the memory element 20.

For example, if the state where the resistance value is high corresponds to information "0" and the state where the resistance value is low corresponds to information "1", "0" can be changed to "1" in the process for recording information with the application of the positive voltage, and "1" can be changed to "0" in the process for erasing information with the application of the negative voltage.

In order to demodulate recorded data, it is preferable that the ratio of the initial resistance value and the resistance value after recording is large. When the resistance value of the resistance change layer is excessively large, since writing, that is, resistance change becomes difficult, and a writing threshold voltage excessively increases, it is desirable that the initial resistance value is equal to or smaller than 1 GΩ. For example, when resistance change layer 22A is made of an oxide of a rare-earth element, the resistance value of the resistance change layer 22A may be controlled by the thickness or the amount of oxygen to be contained.

Although how the writing operation and the erasure operation correspond to low resistance and high resistance differs depending on the definition, in this specification, the low resistance state is defined as the written state, and the high resistance state is defined as the erased state.

As described above, in this embodiment, two first electrodes 21 are connected to the same first bit line 1 BL through different adjacent access transistors Tr and share one memory layer 22. The one memory layer 22 is connected to the single second bit line 2 BL. Accordingly, it becomes possible to simplify the planar shape of the memory layer 22 and to relax the dimension rule. Therefore, even when a material which is not easily dry-etched is used, it becomes possible to easily form the memory layer 22 by the filling of the insulating film 15 into the hole 15A and CMP. It also becomes possible to easily make electrical connection of the second bit line 2 BL to the memory layer 22, and unlike the related art, it is not necessary to form a backing interconnection. Therefore, it becomes possible to stably produce the fine memory element 20 and to miniaturize the memory element 20.

(Second Embodiment)

Figure 18:
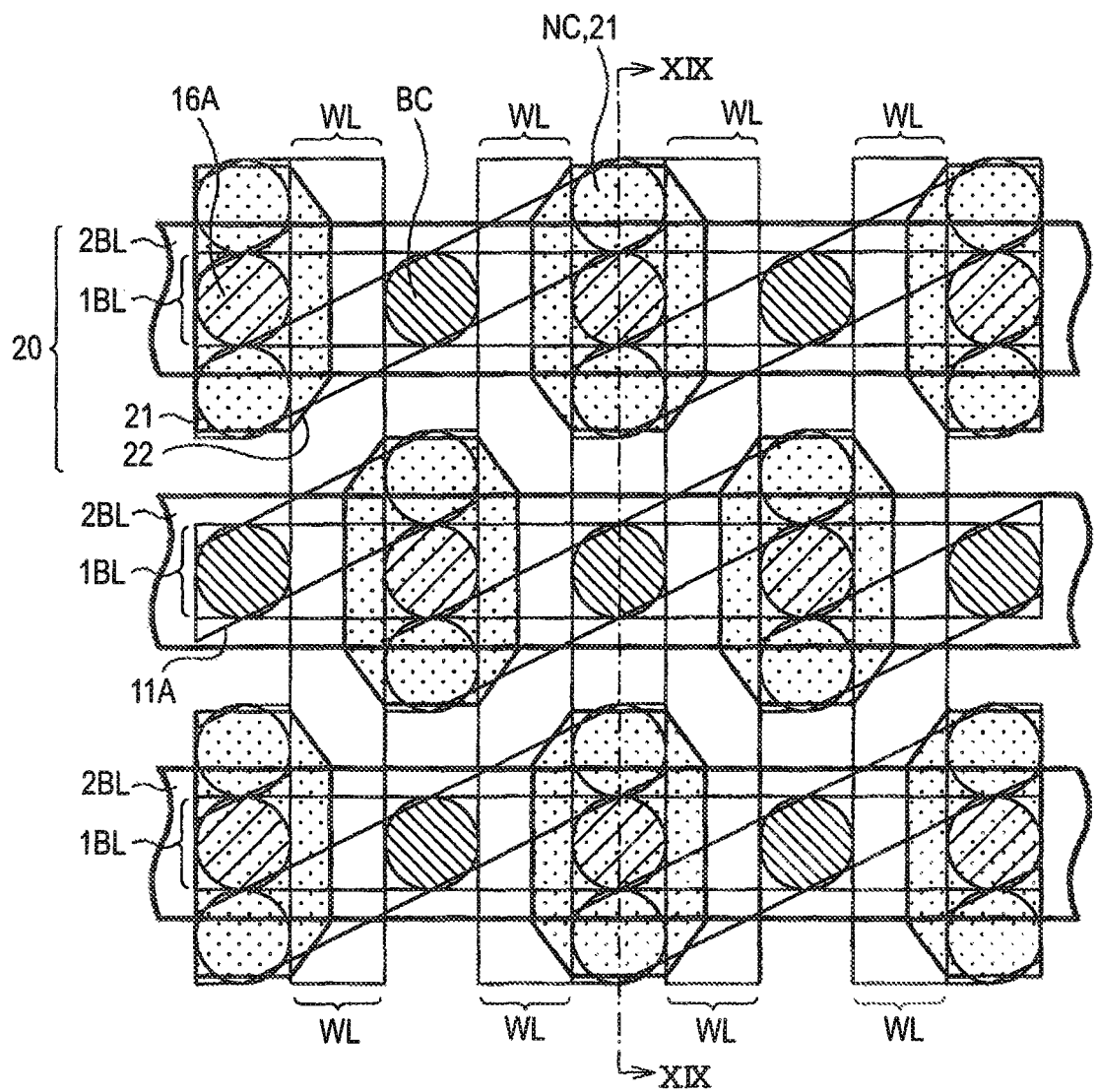
FIG. 18 is a plan view showing the configuration of a memory device according to a second embodiment of the present disclosure.
Figure 19:
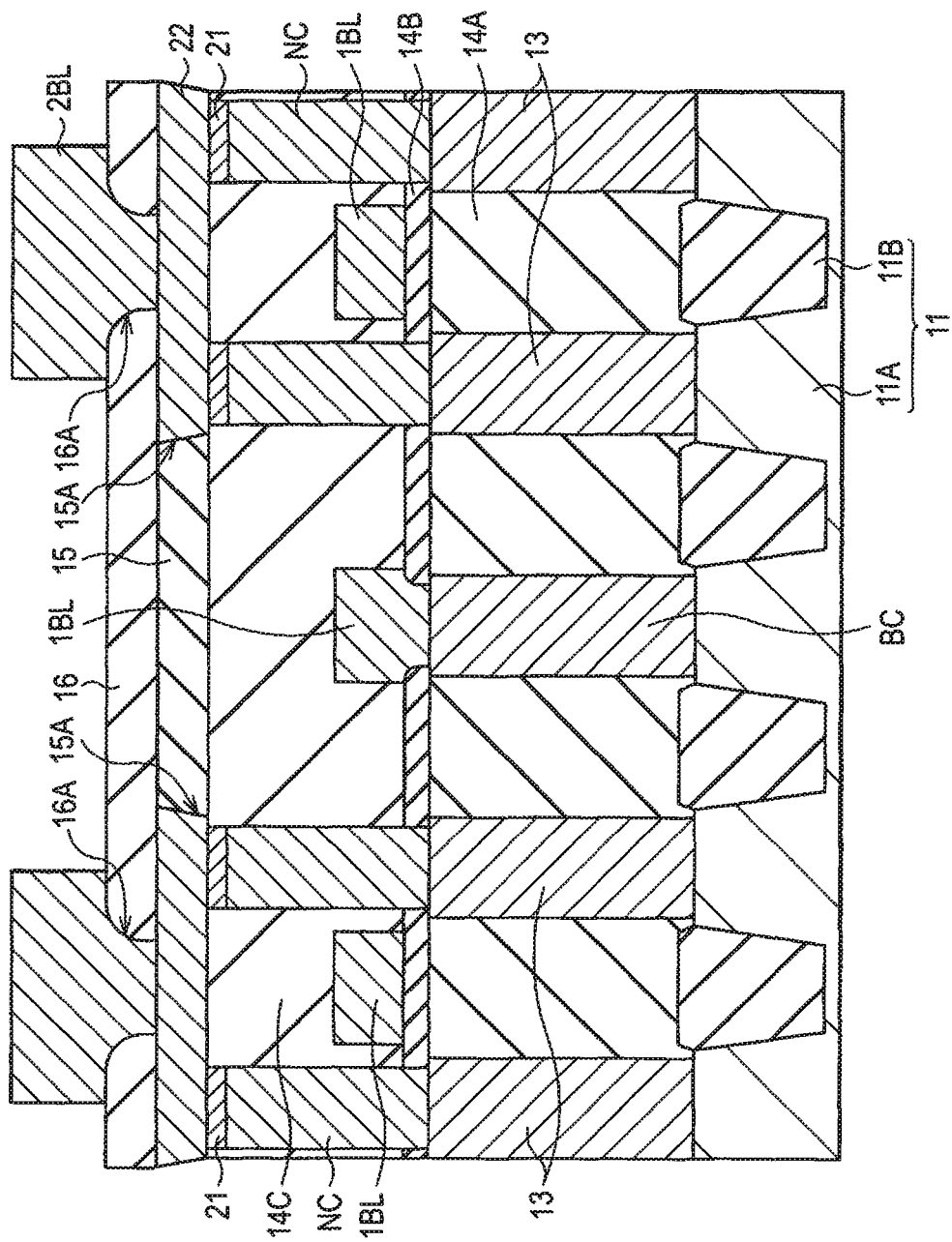
FIG. 19 is a sectional view taken along the line XIX-XIX of FIG. 18.

FIGS. 18 and 19 show the planar configuration of a memory device 1A according to a second embodiment of the present disclosure. In the memory device 1A, an insulating film 16 is provided on the memory layer 22, and the second bit line 2 BL is connected to the memory layer 22 through a contact hole 16A of the insulating film 16. Except for this, the memory device 1A has the same configuration as in the foregoing first embodiment.

In the above-described first embodiment, when the memory layer 22 is thin and the second bit line 2 BL is thick, there is a possibility that the upper portion of the memory layer 22 is cut deeply at the time of overetching for fabricating the second bit line 2 BL, or the memory layer 22 is damaged and sufficient element characteristics are not obtained. In this embodiment, the insulating film 16 is provided on the memory layer 22, and the second bit line 2 BL is connected to the memory layer 22 through the contact hole 16A of the insulating film 16, making it possible to reduce this possibility and maintaining high element characteristics.

The material for the insulating film 16 is a silicon oxide film, a silicon nitride, a low dielectric constant film, or a laminated film thereof which is used in a normal semiconductor process, and is not particularly limited. The thickness of the insulating film 16 should be set to be resistant against overetching of the conductive film when forming the second bit line 2 BL.

FIGS. 20 to 23 show a principal part of a method of manufacturing the memory device 1A in a process sequence. The portions which overlap the manufacturing process of the first embodiment will be described with reference to FIGS. 9 to 17.

First, as in the first embodiment, an element isolation layer 11B is formed on the substrate 11 made of silicon by a normal LSI process, and a plurality of access transistor Tr and transistors constituting peripheral circuits (not shown) are then formed. At this time, the gate of the access transistor Tr becomes the word line WL. The side of the word line WL is covered with the insulating layer 12A.

Subsequently, as in the first embodiment, the insulating interlayer 14A is formed on the access transistor Tr, and a contact hole is provided in the insulating interlayer 14A and filled with, for example, a conductive material, such as polysilicon including phosphorus (P), to form the bit contact electrode BC and the connection plug 13.

Thereafter, as in the first embodiment, with the process shown in FIGS. 9 and 10, the insulating interlayer 14B is formed on the insulating interlayer 14A, the bit contact electrode BC, and the connection plug 13, and a contact hole is provided in the insulating interlayer 14B. Subsequently, a conductive material film, such as tungsten (W), is formed and etched. Thus, the first bit line 1 BL is formed on the bit contact electrode BC.

Subsequently, as in the first embodiment, with the process shown in FIGS. 11 and 12, the insulating interlayer 14C is formed on the first bit line 1 BL and the insulating interlayer 14B, and a contact hole is provided in the insulating interlayer 14C and filed with a conductive material. Accordingly, the node contact electrode NC is formed on the connection plug 13. As in the first embodiment, in the above manufacturing process, the flow of a normal COB DRAM process may be used.

Thereafter, as in the first embodiment, with the process shown in FIGS. 13 and 14, the first electrode 21 is formed on the node contact electrode NC.

Subsequently, as in the first embodiment, with the process shown in FIGS. 13, 14, and 15A, the insulating film 15 is formed on the first electrode 21 and the insulating interlayer 14C. As in the first embodiment, with the process shown in FIG. 15B, the holes 15A are provided in the insulating film 15 in a dotlike pattern. In the hole 15A, two first electrodes 21 connected to the same first bit line 1 BL through different adjacent access transistors Tr are exposed. In other words, in the hole 15A, two adjacent first electrodes 21 in a direction parallel to the extension direction of the word line WL are exposed. Since the holes 15A are provided in a simple repetitive pattern, it becomes easy to use the light interference effect and to secure the exposure margin of lithography.

After the hole 15A is provided in the insulating film 15, the surface treatment (for example, sputter etch etching) of the first electrode 21 in the hole 15A is performed, and as in the first embodiment, with the process shown in FIG. 15C, the memory layer material film 22C is formed on the entire surface of the insulating film 15.

After the hole 15A is filled with the memory layer material film 22C, as in the first embodiment, with the process shown in FIG. 15D, the memory layer material film extruded from the hole 15A is removed by CMP. Accordingly, as in the first embodiment, with the process shown in FIGS. 16 and 17, the memory layer 22 is formed in the hole 15A. Since the holes 15A are provided in a simple repetitive pattern, it becomes easy to suppress or optimize local variations in the polishing rate or dishing, making it possible to secure a sufficient process margin.

Figure 20:
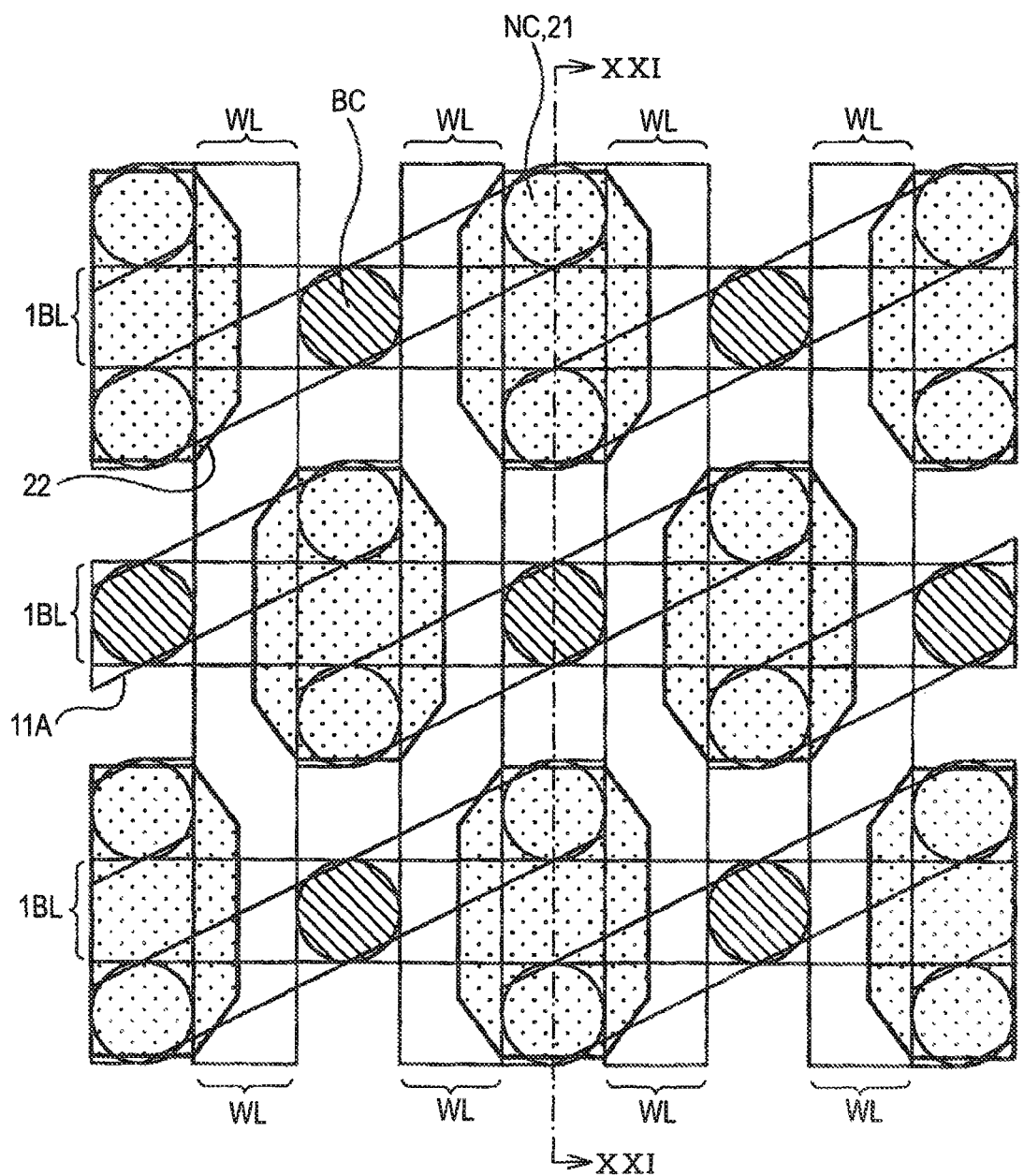
FIG. 20 is a plan view showing a method of manufacturing the memory device shown in FIG. 18 in a process sequence.
Figure 21:
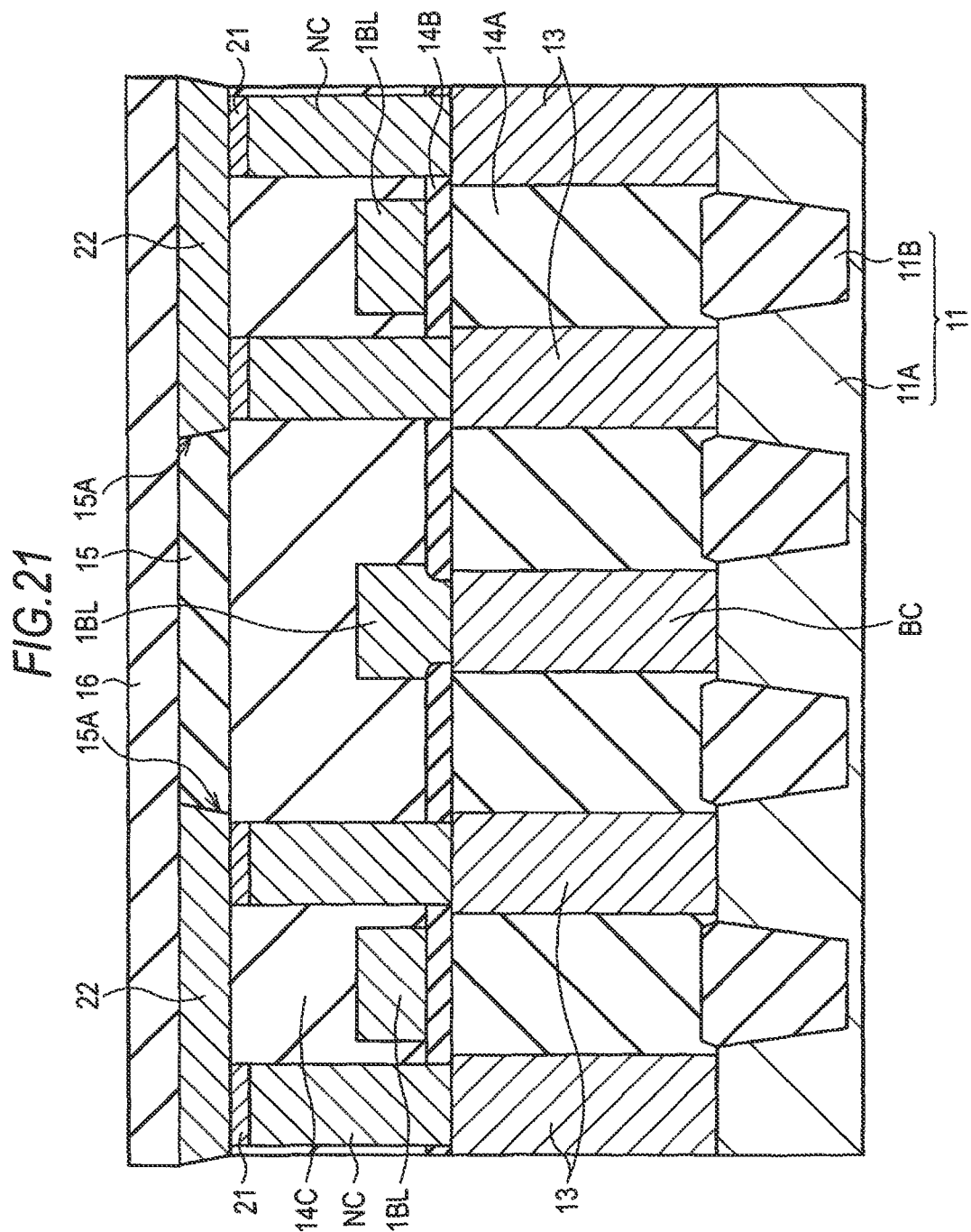
FIG. 21 is a sectional view taken along the line XXI-XXI of FIG. 20.

After the memory layer 22 is formed, as shown in FIGS. 20 and 21, the insulating film 16 is formed of the above-described material on the memory layer 22 to have the above-described thickness.

Figure 22:
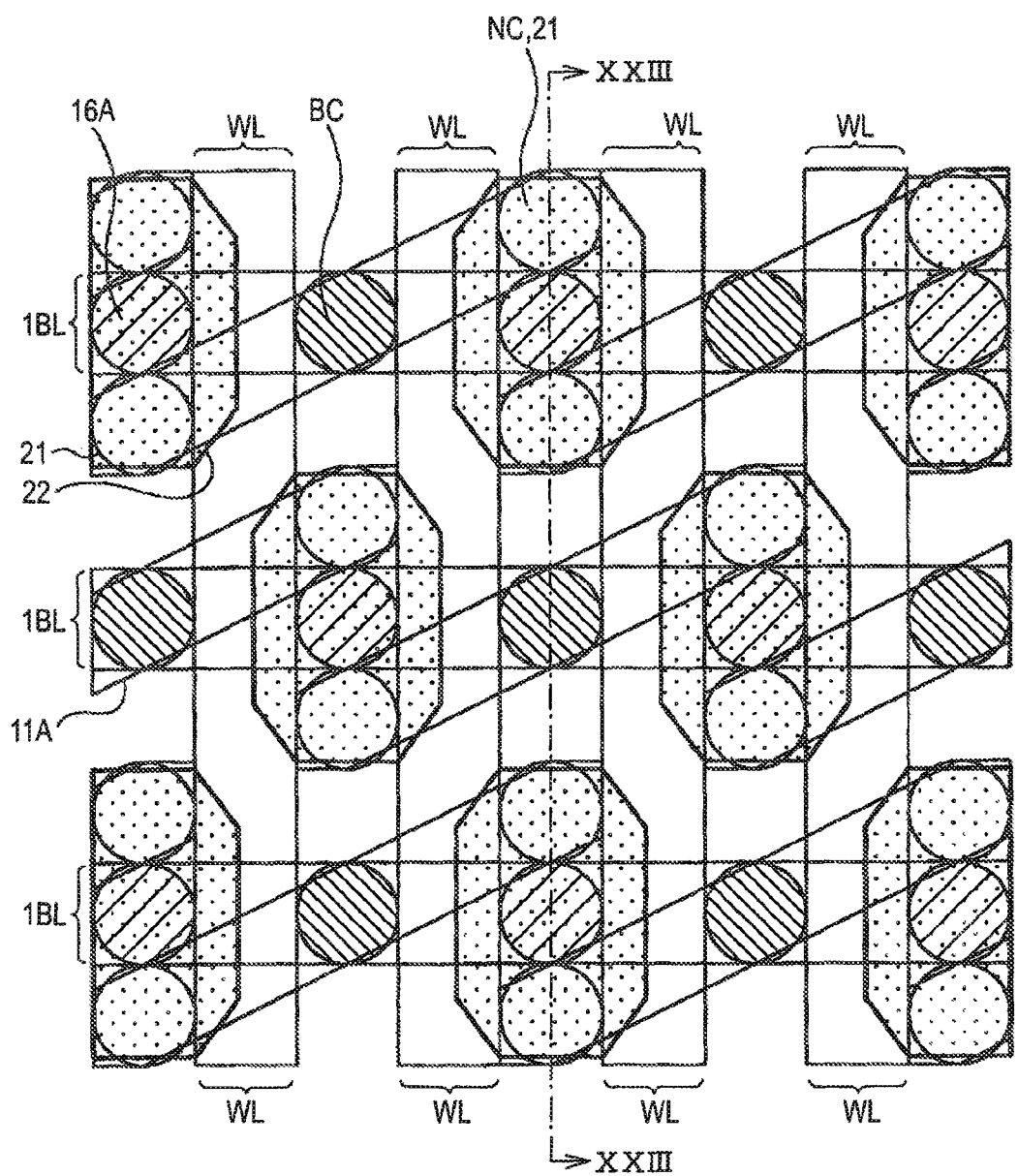
FIG. 22 is a plan view showing a process subsequent to FIG. 20.
Figure 23:
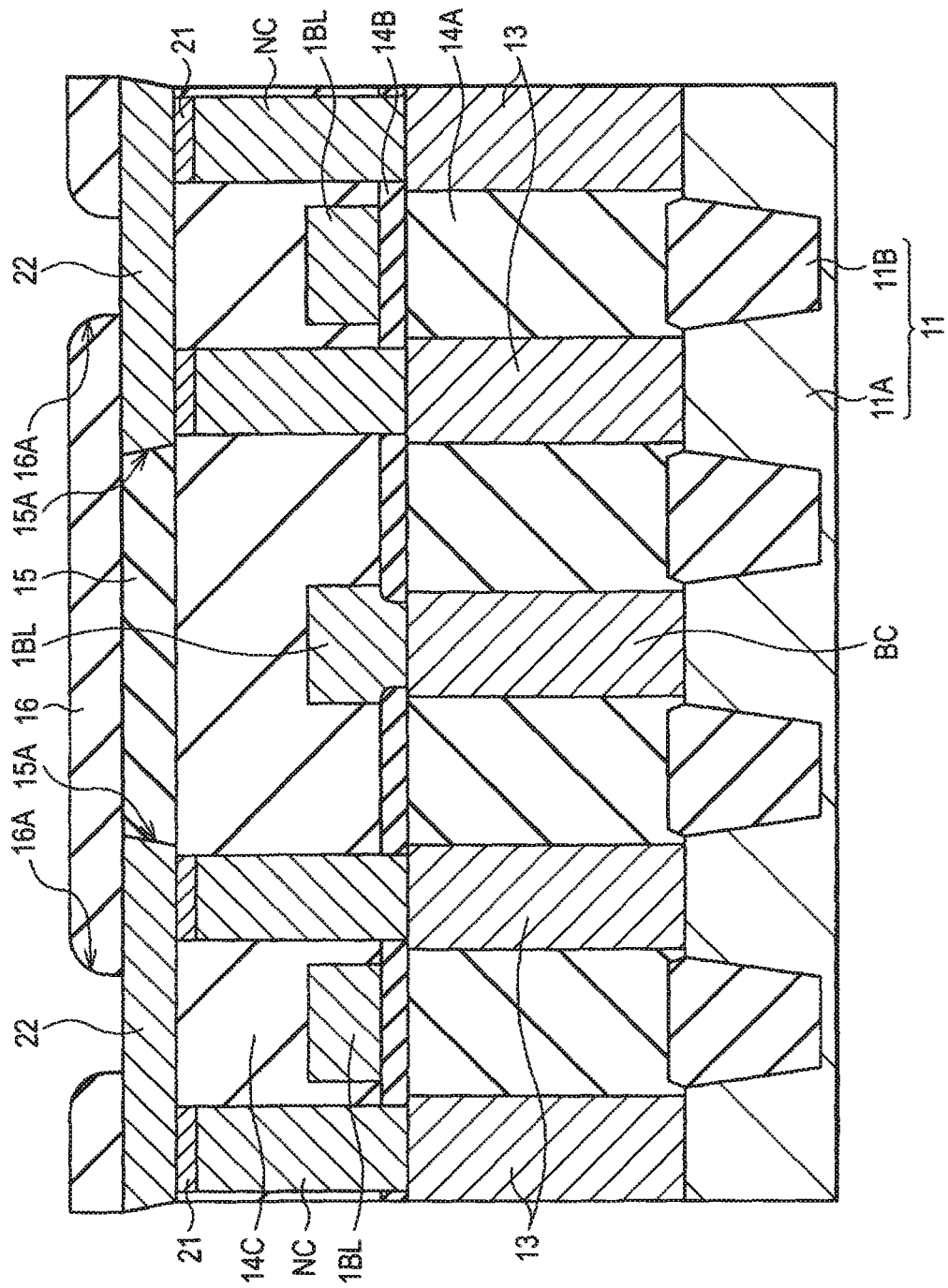
FIG. 23 is a sectional view taken along the line XXIII-XXIII of FIG. 22.

Subsequently, as shown in FIGS. 22 and 23, the contact hole 16A is formed at the position of the insulating film 16 on the memory layer 22. Since it should suffice that one contact hole 16A is formed for each dotlike memory layer 22, in the layout where two first electrodes 21 share one dotlike memory layer 22, the pitch of the contact holes 16A is loose, thereby easily forming the contact hole 16A.

After the contact hole 16A is provided in the insulating film 16, a conductive film (not shown) for forming the second bit line 2 BL is formed. The conductive film may be a single-layered film or a laminated film made of a material, such as tungsten (W), which is easy to fabricate for use in a normal semiconductor process. While the deposition method uses normal sputter deposition, the method is not particularly limited. In order to decrease resistance of the memory layer 22 exposed at the bottom of the contact hole 16A, pretreatment, such as etching, may be performed.

After the conductive film is formed on the memory layer 22, the conductive film is fabricated in the pattern of the second bit line 2 BL by, for example, lithography and etching. The formed pattern of the second bit line 2 BL may be a simple L/S pattern having a pitch looser than the minimum dimension rule, and can be comparatively easily realized.

Even if the conductive film, such as tungsten (W), is somewhat thick, since it becomes easy to secure the selection ratio relative to the insulating film 16 serving as an underlayer at the time of RIE, there is little possibility that the memory layer 22 is damaged at the time of overetching.

Finally, as in the first embodiment, the second bit line 2 BL is covered with an insulating film (not shown), a contact hole (not shown) for connection to an upper interconnect layer (not shown) is formed, and a circuit pattern (not shown) is formed in a form based on a normal semiconductor interconnection process. With the above, the memory device 1A shown in FIGS. 18 and 19 is completed.

The operation of the memory device 1A is the same as in the first embodiment.

As described above, in this embodiment, the second bit line 2 BL is connected to the memory layer 22 through the contact hole 16A of the insulating film 16. For this reason, in addition to the effects of the first embodiment, even when the second bit line 2 BL is thick compared to the memory layer 22, it becomes possible to stably produce the fine memory element 20.

(Third Embodiment)

Figure 24:
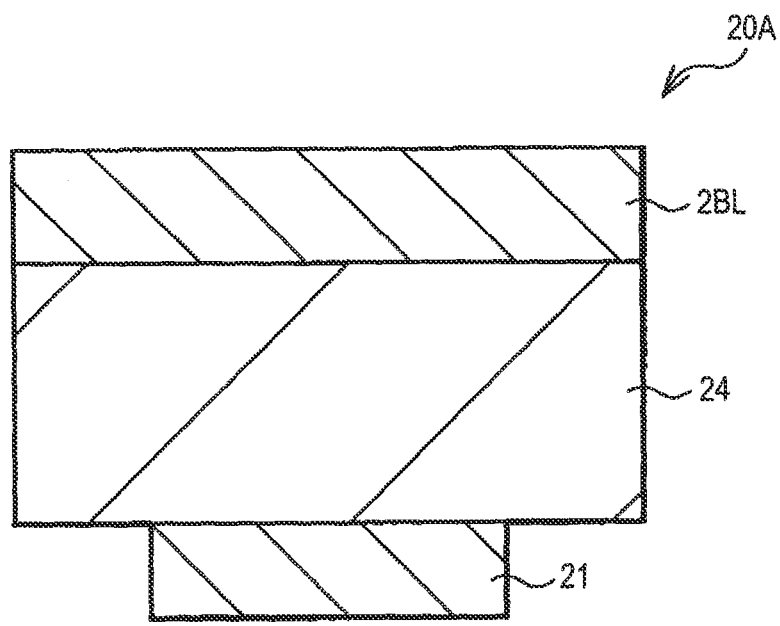
FIG. 24 is a sectional view showing the configuration of a memory element according to a third embodiment of the present disclosure.

FIG. 24 shows the configuration of a memory element 20A of a memory device 1 according to a third embodiment of the present disclosure. The memory device 1 has the same configuration, action, and effects as in the first or second embodiment, except that the memory element 20A is constituted by a PCM (Phase Change Memory) (phase change memory), and can be manufactured in the same manner as in the first or second embodiment. Accordingly, in the following description, the corresponding components are represented by the same reference numerals.

The memory element 20A is the PCM in which a memory layer 24 made of a GeSbTe alloy, such as $Ge_2Sb_2Te_5$, is provided between the first electrode 21 and the second bit line 2 BL. The memory layer 24 undergoes a phase change between a crystalline state and an amorphous state with the application of a current, and the resistance value reversibly changes depending on the phase change.

In the memory device 1, the potentials on both the first bit line 1 BL and the second bit line 2 BL change to Vc or GND in a complementary manner, such that the voltage +Vc or −Vc is applied between the first electrode 21 of the memory element 20 and the second bit line 2 BL from a power supply (pulse application unit) (not shown). Accordingly, the memory layer 24 changes from the high-resistance amorphous state to the low-resistance crystalline state (or from the low-resistance crystalline state to the high-resistance amorphous state). This process is repeated, thereby repeatedly writing and erasing information in the memory element 20A.

(Fourth Embodiment)

Figure 25:
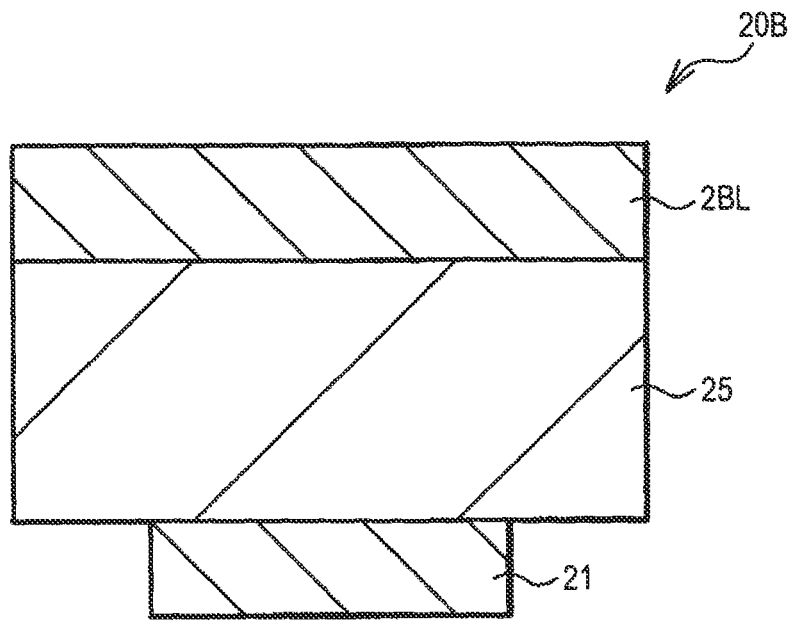
FIG. 25 is a sectional view showing the configuration of a memory element according to a fourth embodiment of the present disclosure.

FIG. 25 shows the configuration of a memory element 20B of a memory device 1 according to a fourth embodiment of the present disclosure. The memory device 1 has the same configuration, action, and effects as in the first or second embodiment, except that the memory element 20B is constituted by a ReRAM (Resistive Random Access Memory) (resistance change memory), and can be manufactured in the same manner as in the first or second embodiment. Accordingly, in the following description, the corresponding components are represented by the same reference numerals.

The memory element 20B is a ReRAM in which a memory layer 25 made of an oxide, such as NiO, $TiO_2$, or $PrCaMnO_3$, is provided between the first electrode 21 and the second bit line 2 BL, and the resistance value reversibly changes with the application of a voltage to the oxide.

In the memory device 1, the potentials on both the first bit line 1 BL and the second bit line 2 BL change to Vc or GND in a complementary manner, such that the voltage +Vc or −Vc is applied between the first electrode 21 of the memory element 20 and the second bit line 2 BL from a power supply (pulse application unit) (not shown). Accordingly, the memory layer 25 changes from the high-resistance state to the low-resistance state (or from the low-resistance state to the high-resistance state). This process is repeated, thereby repeatedly writing and erasing information in the memory element 20B.

Although the present disclosure has been described in connection with the embodiments, the present disclosure is not limited to the foregoing embodiments and may be modified in various formed.

For example, the materials of the respective layers, the deposition methods, the deposition conditions, and the like described in the foregoing embodiments are not limited, and other materials may be used or other deposition methods may be used.

For example, although in the foregoing embodiments, the configuration of the memory element 20, 20A, or 20B and the memory device 1 or 1A has been specifically described, all layer may not be provided, and other layers may be further provided. For example, although in the foregoing embodiments, a case where the second electrode (upper electrode) of the memory element 20 and the second bit line 2 BL are used together has been described, the second electrode of the memory element 20 may be provided separately from the second bit line 2 BL.

Figure 26:
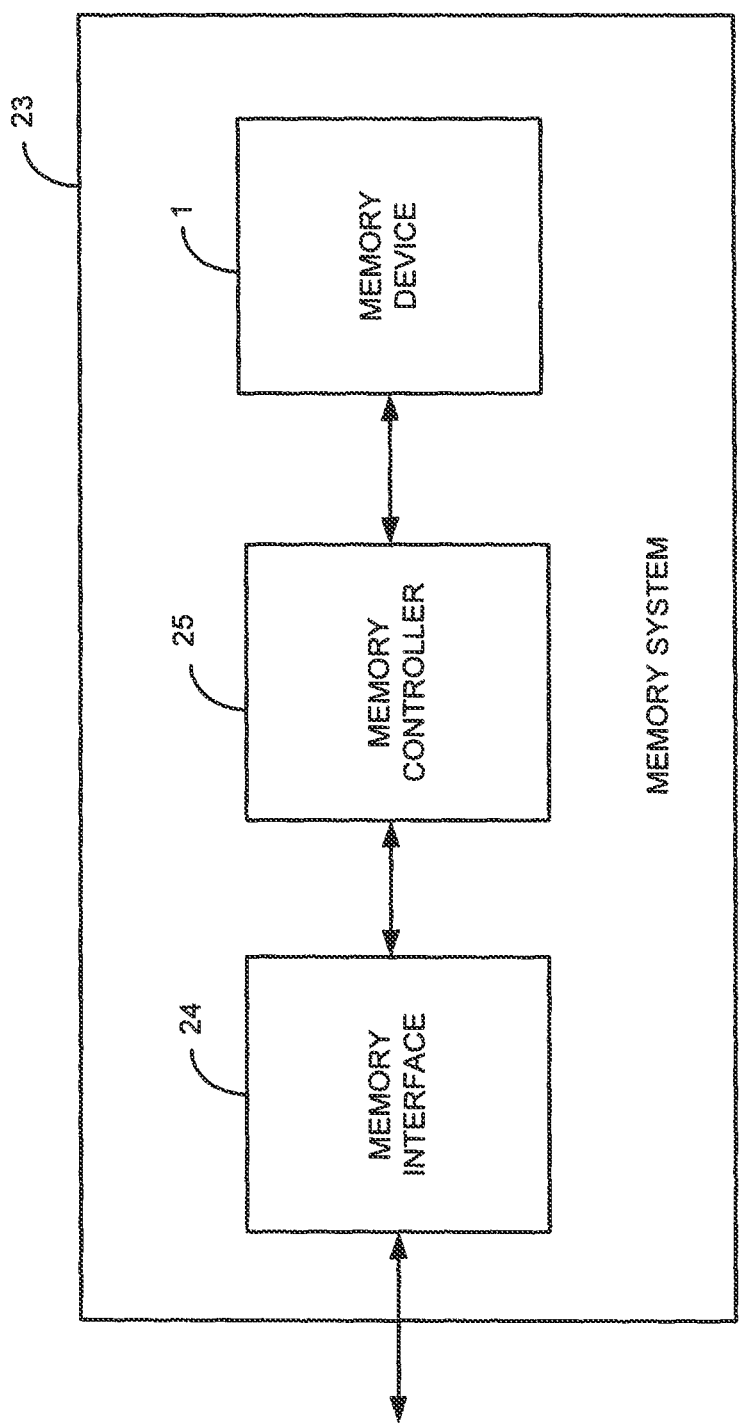
FIG. 26 is a block diagram showing the configuration of a memory system having the memory device of FIG. 1.

In FIG. 26, a memory system 23 includes a memory interface 24, a memory controller 25, and a memory device 1. In this example, the memory controller 25 is operatively connected to the memory interface 24 and the memory device 1. The memory controller 25 is configured to control operations of the memory device 1. The memory device 1 has been described above in the present disclosure. The memory device 1 includes a plurality of memory elements. Each memory element has a first electrode, a second electrode, and a memory layer between the first electrode and the second electrode. The plurality of memory layers are in a dotlike pattern. Two adjacent first electrodes share a same memory layer.

The present disclosure may be implemented as the following configuration.

(1) A memory device comprising:
a plurality of memory elements, each memory element having a first electrode, a second electrode, and a memory layer between the first electrode and the second electrode,
wherein, the plurality of memory layers are in a dotlike pattern, and two adjacent first electrodes share a same memory layer.

(2) The memory device of (1) further comprising:
a plurality of access transistors operatively connected to the plurality of memory elements and that are controlled by a plurality of word lines,
wherein, the two adjacent first electrodes are connected to a same first bit line through corresponding two adjacent access transistors, and two adjacent memory layers in a direction perpendicular to an extension direction of the plurality of word lines are connected to a same second bit line.

(3) The memory device of (2), wherein: one of a source and a drain of each access transistor is connected to the corresponding first bit line through a bit contact electrode; and
the other one of the source and the drain of the access transistor is connected to the corresponding first electrode through a node contact electrode.

(4) The memory device of (3), wherein:
one bit contact electrode is shared by two adjacent access transistors; and
one node contact electrode is provided for each access transistor.

(5) The memory device of (2), wherein the second electrode functions as the second bit line.

(6) The memory device of (2), wherein potentials applied on both the first bit line and the second bit line change between a positive potential and ground in a complementary manner, such that a positive voltage or a negative voltage is applied to each memory layer.

(7) The memory device of (2), wherein:
a width of each word line and the first bit line is equal to a minimum dimension rule;
a pitch of a plurality of first bit lines is three times greater than the minimum dimension rule; and
a pitch of the word lines is twice greater than the minimum dimension rule.

(8) The memory device of (1), wherein:
each memory layer comprises a resistance change layer and an ion source layer;
the ion source layer includes at least one chalcogen element as an anodic ion conducive material and at least one metal element as a cationic element; and
the resistance change layer is made of a material having a resistance value greater than that of the ion source layer and has a function as an electrical conductive barrier.

(9) The memory device of (1), wherein:
each memory element is a phase change memory; and
each memory layer is made of a GeSbTe alloy.

(10) The memory device of (1), wherein:
each memory element is a resistive change memory; and
each memory layer is made of an oxide.

(11) The memory device of (1), wherein the memory layer is filled in a hole provided in an insulating film on the first electrode.

(12) The memory device of (2), wherein the second bit line is in a direction parallel to the first bit line.

(13) A method for manufacturing a memory device, comprising:
forming a plurality of memory elements on a semiconductor substrate, each memory element having a first electrode, a second electrode, and a memory layer between the first electrode and the second electrode,
wherein, the plurality of memory layers are in a dotlike pattern, and two adjacent first electrodes share a same memory layer.

(14) The method of (13), further comprising:
forming a plurality of access transistors on the semiconductor substrate; and
connecting a plurality of word lines to the plurality of access transistors,
wherein, the two adjacent first electrodes are connected to a same first bit line through corresponding two adjacent access transistors, and two adjacent memory layers in a direction perpendicular to an extension direction of the plurality of word lines are connected to a same second bit line.

(15) The method of (14), further comprising:
connecting a bit contact electrode to each access transistor;
connecting the first bit line to the bit contact electrode;
connecting a node contact electrode to each access transistor; and
forming the corresponding first electrode on the node contact electrode.

(16) The method of (14), wherein forming a plurality of memory elements comprises:
covering an upper portion of the first electrode with an insulating film;
forming a hole in the insulating film to expose the two adjacent first electrodes connected to the same first bit line through the corresponding two adjacent access transistors;
filling the hole with a memory layer material film; and
removing the memory layer material film extruded from the hole by chemical mechanical polishing.

(17) The method of (14), further comprising:
forming an insulating film on each memory layer; and
connecting the second bit line to the corresponding memory layer through a contact hole in the insulating film.

(18) The method of (14), wherein:
a width of each word line and the first bit line is equal to a minimum dimension rule;
a pitch of a plurality of first bit lines is three times greater than the minimum dimension rule; and
a pitch of a plurality of second bit lines is twice greater than the minimum dimension rule.

(19) The method of (13), wherein:
each memory layer comprises a resistance change layer and an ion source layer;
the ion source layer includes at least one chalcogen element as an anodic ion conducive material and at least one metal element as a cationic element; and
the resistance change layer is made of a material having a resistance value greater than that of the ion source layer and has a function as an electrical conductive barrier.

(20) A memory system comprising:
a memory interface;
a memory device comprising a plurality of memory elements, each memory element having a first electrode, a second electrode, and a memory layer between the first electrode and the second electrode; and
a memory controller operatively connected to the memory interface and the memory device, configured to control operations of the memory device,
wherein, the plurality of memory layers are in a dotlike pattern, and two adjacent first electrodes share a same memory layer.

The present disclosure contains subject matter related to that disclosed in Japanese Priority Patent Application JP 2011-161201 filed in the Japan Patent Office on Jul. 22, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A memory device comprising:
a plurality of memory elements, each memory element having a first electrode, a second electrode, and a memory layer between the first electrode and the second electrode; and
a plurality of access transistors operatively connected to the plurality of memory elements and controlled by a plurality of word lines,
wherein,
a plurality of memory layers provided for the plurality of memory elements are in a dotlike pattern,
two adjacent first electrodes from corresponding two adjacent memory elements share one memory layer,
the one memory layer fills a hole in an insulating film provided over the two adjacent first electrodes, the hole exposing the two adjacent first electrodes and being filled with the one memory layer, and
the one memory layer extends over the two adjacent first electrodes in a direction parallel to an extension direction of the plurality of word lines.

2. The memory device of claim 1 further comprising:
a plurality of bit lines including first bit lines and second bit lines,
wherein,
the two adjacent first electrodes are connected to one first bit line through corresponding two adjacent access transistors, and
two memory layers adjacent to each other in a direction perpendicular to the extension direction of the plurality of word lines are connected to one second bit line.

3. The memory device of claim 2, wherein:
one of a source and a drain of each access transistor is connected to a corresponding first bit line through a bit contact electrode, and
the other one of the source and the drain of the access transistor is connected to a corresponding first electrode through a node contact electrode.

4. The memory device of claim 3, wherein:
one bit contact electrode is shared by two adjacent access transistors, and
one node contact electrode is provided for each access transistor.

5. The memory device of claim 2, wherein the second bit line functions as the second electrode.

6. The memory device of claim 2, wherein potentials applied to both the first bit line and the second bit line change between a positive potential and a ground potential in a complementary manner, such that a positive voltage or a negative voltage is applied to each memory layer.

7. The memory device of claim 2, wherein:
a width of each word line and each first bit line is equal to a minimum dimension rule,
a pitch of the first bit lines is three times greater than the minimum dimension rule, and
a pitch of the word lines is twice greater than the minimum dimension rule.

8. The memory device of claim 1, wherein:
each memory layer comprises a resistance change layer and an ion source layer,
the ion source layer includes at least one chalcogen element as an anodic ion conducive material and at least one metal element as a cationic element, and
the resistance change layer is made of a material having a resistance value greater than that of the ion source layer and has a function of an electrical conductive barrier.

9. The memory device of claim 1, wherein:
each memory element is a phase change memory, and
each memory layer is made of a GeSbTe alloy.

10. The memory device of claim 1, wherein:
each memory element is a resistive change memory, and
each memory layer is made of an oxide.

11. The memory device of claim 2, wherein the second bit line is disposed in parallel to the first bit line.

12. A method for manufacturing a memory device, comprising:
forming a plurality of memory elements on a semiconductor substrate, each memory element having a first electrode, a second electrode, and a memory layer between the first electrode and the second electrode;
forming a plurality of access transistors on the semiconductor substrate; and
connecting a plurality of word lines to the plurality of access transistors,
wherein,
a plurality of memory layers formed for the plurality of memory elements are in a dotlike pattern,
two adjacent first electrodes from corresponding two adjacent memory elements share one memory layer,
the one memory layer fills a hole in an insulating film formed over the two adjacent first electrodes, the hole exposing the two adjacent first electrodes and being filled with the one memory layer, and
the one memory layer extends over the two adjacent first electrodes in a direction parallel to an extension direction of the plurality of word lines.

13. The method of claim 12, further comprising:
forming a plurality of bit lines including first bit lines and second bit lines on the semiconductor substrate,
wherein,
the two adjacent first electrodes are connected to one first bit line through corresponding two adjacent access transistors, and
two memory layers adjacent to each other in a direction perpendicular to the extension direction of the plurality of word lines are connected to one second bit line.

14. The method of claim 13, further comprising:
connecting a bit contact electrode to each access transistor;
connecting the first bit line to the bit contact electrode;
connecting a node contact electrode to each access transistor; and
forming a corresponding first electrode on the node contact electrode.

15. The method of claim 12, wherein forming the plurality of memory elements includes:
covering an upper portion of the first electrode of each memory element with the insulating film;
forming the hole in the insulating film to expose the two adjacent first electrodes;
filling the hole with a memory layer material film to form the one memory layer shared by the two adjacent first electrodes; and
removing the memory layer material film extruded from the hole by chemical mechanical polishing.

16. The method of claim 13, further comprising:
forming another insulating film on each memory layer; and
connecting a respective second bit line to a corresponding memory layer through a contact hole in the other insulating film.

17. The method of claim 13, wherein:
a width of each word line and each first bit line is equal to a minimum dimension rule,
a pitch of the first bit lines is three times greater than the minimum dimension rule, and
a pitch of the word lines is twice greater than the minimum dimension rule.

18. The method of claim 12, wherein:
each memory layer comprises a resistance change layer and an ion source layer,
the ion source layer includes at least one chalcogen element as an anodic ion conducive material and at least one metal element as a cationic element, and
the resistance change layer is made of a material having a resistance value greater than that of the ion source layer and has a function as an electrical conductive barrier.

19. A memory system comprising:
a memory interface;
a memory device comprising
(a) a plurality of memory elements, each memory element having a first electrode, a second electrode, and a memory layer between the first electrode and the second electrode, and (b) a plurality of access transistors operatively connected to the plurality of memory elements and controlled by a plurality of word lines; and (c) a memory controller operatively connected to the memory interface and the memory device, and configured to control operations of the memory device, wherein, a plurality of memory layers provided for the plurality of memory elements are in a dotlike pattern, two adjacent first electrodes from corresponding two adjacent memory elements share one memory layer, the one memory layer fills a hole in an insulating film provided over the two adjacent first electrodes, the hole exposing the two adjacent first electrodes and being filled with the one memory layer, and the one memory layer extends over the two adjacent first electrodes in a direction parallel to an extension direction of the plurality of word lines.

* * * * *